(12) United States Patent
Yan

(10) Patent No.: US 7,298,221 B2
(45) Date of Patent: Nov. 20, 2007

(54) PHASE-LOCKED LOOP CIRCUITS WITH CURRENT MODE LOOP FILTERS

(75) Inventor: Gang Yan, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 74 days.

(21) Appl. No.: 11/353,832

(22) Filed: Feb. 13, 2006

(65) Prior Publication Data

US 2006/0197611 A1 Sep. 7, 2006

Related U.S. Application Data

(60) Provisional application No. 60/654,993, filed on Feb. 22, 2005.

(51) Int. Cl.
H03L 7/00 (2006.01)
(52) U.S. Cl. .......................................... 331/17; 331/16
(58) Field of Classification Search ................. 331/17, 331/16
See application file for complete search history.

(56) References Cited

U.S. PATENT DOCUMENTS 7,148,757 B2 * 12/2006 Chiu .......................... 331/16

OTHER PUBLICATIONS

Maneatis, et al., "Self-Biased High-Bandwidth Low-Jitter 1-to-4096 Multiplier Clock Generator PLL," DAC 2003, Jun. 2-6, 2003, Anaheim, California, USA, pp. 688-690.
Lee et al., "A 155-MHz Clock Recovery Delay- and Phase-Locked Loop," IEEE Journal of Solid-State Circuits., Vo. 27, No. 12, Dec. 1992, pp. 1736-1756.
Cramomcix et al., "A Fully Integrated CMOS DCS-1800 Frequency Synthesizer," IEEE Journal of Solid-State Circuits., vol. 33, No. 12, Dec. 1998, pp. 2054-2065.
Maxim et al., "A Low-Jitter 125-1250-MHz Process-Independent and Ripple-Poleless .18 μm CMOS PLL Based on a Sample-Reset Loop Filter," IEEE Journal of Solid-State Circuits, vol. 36, No. 11, Nov. 2001, pp. 1673-1683.
Maneatis et al., "Self-Biased High-Bandwidth Low-Jitter 1-to-4096 Multiplier Clock Generator PLL," IEEE Journal of Solid-State Circuits, vol. 38, No. 11, Nov. 2003, pp. 1795-1803.
Yang et al., "A Low Jitter 0.3-165 MHz CMOS PLL Frequency Synthesizer for 3 V/5 V Operation," IEEE Journal of Solid-State Circuits, vol. 32, No. 4, Apr. 1997, pp. 582-586.

(Continued)

Primary Examiner—Joseph Chang
(74) Attorney, Agent, or Firm—Myers Bigel Sibley & Sajovec

(57) ABSTRACT

A phase-locked loop (PLL) includes a phase-frequency detector circuit configured to detect an error of an output clock signal in relation to a reference clock signal and to generate a charge pump control signal therefrom and a charge pump circuit configured to charge and discharge an output node thereof responsive to the charge pump control signal. The PLL further includes a current-mode loop filter circuit coupled to the output node of the charge pump circuit and configured to generate a filtered current from the current at the output node of the charge pump circuit, and a current-controlled oscillator configured to generate the output clock signal responsive to the filtered current. The current-mode loop filter circuit may be self-biased. For example, the current-mode loop filter circuit and the charge pump may be biased responsive to a common bias control signal generated by the current-mode loop filter circuit.

17 Claims, 26 Drawing Sheets

OTHER PUBLICATIONS

Maneatis, John G., "Low-Jitter Process-Independent DLL and PLL Based on Self-Biased Techniques," IEEE Journal of Solid-State Circuits, vol. 31, No. 11, Nov. 1996, pp. 1723-1732.

Sidiropoulos, et al., "Adaptive Bandwidth DLLs and PLLs using Regulated Supply CMOS Buffers," 2000 Symposium on VLSI Circuits Digest of Technical Papers, pp. 124-127.

Lee et al., "CMOS Continuous-Time Current-Mode Filters for High-Frequency Applications," IEEE Journal of Solid-State Circuits, vol. 28, No. 3, Mar. 1993, pp. 323-329.

Zele et al., "Low-Power CMOS Continuous-Time Filters," IEEE Journal of Solid-State Circuits, vol. 31, No. 2, Feb. 1996, pp. 157-168.

Young et al., "A PLL Clock Generator with 5 to 110 MHz of Lock Range for Microprocessors," IEEE Journal of Solid-State Circuits, vol. 27, No. 11, Nov. 1992, pp. 1599-1607.

* cited by examiner

PHASE-LOCKED LOOP CIRCUITS WITH CURRENT MODE LOOP FILTERS

RELATED APPLICATION

The present application claims the benefit of U.S. Provisional Application Ser. No. 60/654,993, filed Feb. 22, 2005, the disclosure of which is hereby incorporated herein by reference in its entirety.

BACKGROUND OF THE INVENTION

The present invention relates to electronic circuits and methods of operation thereof and, more particularly, to phase locked loop (PLL) circuits and methods.

Clock frequencies used in digital circuits have increased with the rapid development of CMOS technology, as well as the steady improvement in electronic technology. A common approach to design of digital circuit is synchronous design, which typically uses a master clock. Clock requirements for high-speed digital systems have become increasingly stringent. These typically include low clock jitter, 50% duty cycle, low-voltage operation, low power consumption and compatibility with digital technology. Therefore, clock generating circuit design has become of significant importance.

Clock generating circuits may be classified as open loop and closed-loop. A typical open-loop clock generating circuit includes a crystal oscillator, an RC oscillator, an LC resonance circuit, a ring oscillator and a direct digital frequency synthesizer (DDFS). Generally speaking, a typical clock generating circuit without a reference frequency needs fine-tuning to obtain a desired frequency. In the above-mentioned oscillating circuits, the crystal oscillator, due to its higher Q-factor, can produce a low-jitter clock, so it is often used as a reference clock. The DDFS typically requires a reference clock to work out, via mathematical operations, the value of the desired frequency sampled by the reference clock. After digital-to-analog conversion of the digital amplitude sequence, the desired clock can be obtained through filtering. According to Nyquist sampling theory, the DDFS can synthesize a clock with a frequency less than half the reference frequency. However, due to physical constraints, the clock frequency generated by an open-loop clock generating circuit may not be high.

Closed-loop clock generating circuits include automatic frequency control (AFC) circuits and phase-locked loop (PLL) circuits. AFC circuits, which may be prone to frequency error, have generally declined in popularity, while PLL circuits have become a popular choice for frequency synthesis. PLLs may accurately synthesize a clock of very high speed, with frequency typically restricted only by the fabrication process used. A clock signal produced by a PLL can have good jitter performance. Special clocks can also be achieved using PLL. Examples of PLL applications include spread-spectrum clocks for reducing electromagnetic interference, multi-phase clocks, and clock data recovery.

Early PLLs used an analog multiplier as a phase discriminator. Because clock signals typically are square waves, filtering is often done to produce the sine waves, which may be very inconvenient. Moreover, difficulties in the design of analog multipliers can make the design of a PLL using an analog multiplier difficult.

A typical charge pump PLL uses a digital phase discriminator to compare square wave signals and can eliminate static phase contrast used in traditional PLLs. As digital phase discriminator design may be considered mature, designers may focus their attention on loop filter and voltage controlled oscillator (VCO) design. Charge pump PLLs typically can be highly integrated using digital CMOS technology.

Two types of oscillators that are widely used in charge pump PLLs are ring oscillators and LC oscillators. An LC oscillator, which requires on-chip inductance, may provide a clock with low phase noise. But the oscillating frequency may be limited to a small range. A ring oscillator, which may be compatible with digital technology, may provide wider frequency range. Ring oscillators are commonly used in PLLs to save cost.

Many digital chips today include one or more PLLs. The output frequencies of these PLLs may be different, and the requirements for the PLLs may not be the same. Design of such PLLs may require a lot of resources, manpower and time. A general-purpose or quasi-general-purpose PLL may, therefore, be desirable. A self-biased PLL with current steering digital to analog converter (IDAC) is an example of a general-purpose PLL, proposed in J. Maneatis et al., "Self-biased high-bandwidth low-jitter 1-to-4096 multiplier clock generator PLL," *IEEE Int. Solid-State Circuits Conf. Dig. Tech. Papers*, February 2003, pp. 424-425. A potential disadvantage of such a PLL is its complexity.

SUMMARY OF THE INVENTION

In some embodiments of the present invention, a phase-locked loop (PLL) includes a phase-frequency detector circuit configured to detect an error of an output clock signal in relation to a reference clock signal and to generate a charge pump control signal therefrom and a charge pump circuit configured to charge and discharge an output node thereof responsive to the charge pump control signal. The PLL further includes a current-mode loop filter circuit coupled to the output node of the charge pump circuit and configured to generate a filtered current from the current at the output node of the charge pump circuit, and a current-controlled oscillator configured to generate the output clock signal responsive to the filtered current. The current-mode loop filter circuit may be self-biased. For example, the current-mode loop filter circuit and the charge pump may be biased responsive to a common bias control signal generated by the current-mode loop filter circuit.

In further embodiments of the present invention, the current-mode loop filter circuit includes first and second transistors arranged as a current mirror circuit, the first transistor having a current path and a control electrode therefor coupled to the output node of the charge pump circuit. The filter further includes a filter network configured to be coupled between the control electrode of the first transistor and a control electrode of the second transistor. The current-mode loop filter circuit may be configured to enable and disable current integration by the filter responsive to the charge pump control signal. For example, the current-mode loop filter circuit may include a switch configured to make and break a coupling of the control electrodes of the first and second transistors through the filter network responsive to the charge pump control signal. In some embodiments, the charge pump control signal includes an advance signal and a retard signal, the charge pump is configured charge and discharge the output node responsive to respective ones of the advance and retard signals, and the switch is configured to couple the control electrodes of the first and second transistors through the filter network responsive to assertion of either of the advance and retard signals and to decouple the control electrodes of the first and second transistors responsive to deassertion of both the advance signal and the retard signal.

In additional embodiments of the present invention, the filter network may include an RC filter network. For example, the filter network may be a second or higher order RC filter network. In certain embodiments, the filter network includes a first resistance having a first terminal configured to be coupled to the control electrode of the first transistor, a second resistance coupled between a second terminal of the first resistance and the control electrode of the second transistor, a first capacitance coupled between the second terminal of the first resistance and a ground node, a second capacitance coupled between the control electrode of the second transistor and the ground node, and a series combination of a third resistance and a third capacitance coupled between the second terminal of the first resistance and the ground node.

In certain embodiments of the present invention, the first and second transistors include respective NMOS transistors. The first and second transistors may have a channel length substantially greater than a minimum channel length of a fabrication process in which they are implemented. For example, the first and second transistors may be implemented in a 0.35 µm process, and may have a channel length of around 1.5 µm.

According to further aspects of the present invention, the current-mode loop filter circuit further includes a bias circuit coupled between the current mirror circuit and a power supply voltage source and configured to bias the current mirror circuit responsive to a bias control signal generated at a controlled electrode of the second transistor. The current-mode loop filter circuit may further include a noise canceling circuit and a cascode current source coupled between the current mirror circuit and the current-controlled oscillator. A feedback divider circuit may be coupled between the current-controlled oscillator circuit and an input of the phase-frequency detector circuit. The feedback divider circuit may include a series combination of a programmable divider and a dual modulus prescaler. The current-controlled oscillator circuit may include, for example, a current-controlled ring oscillator circuit.

DETAILED DESCRIPTION

Figure 1:
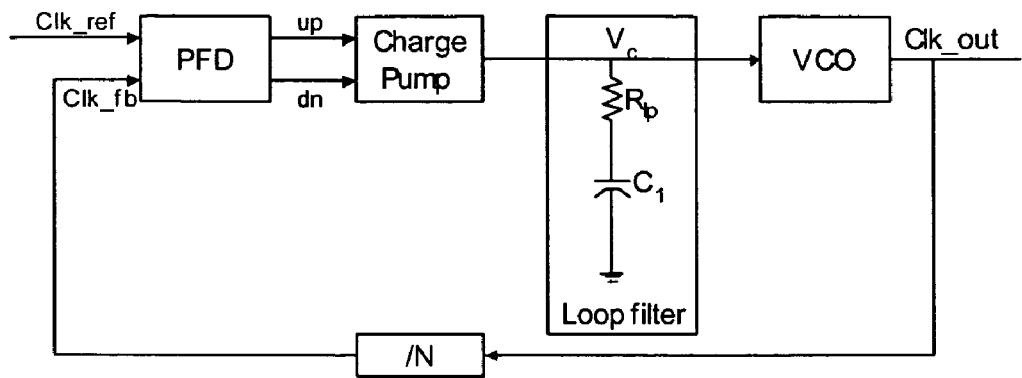
FIGS. 1 and 2 illustrate a conventional PLL.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Overview: Analysis of PLL Circuits

Figure 2:
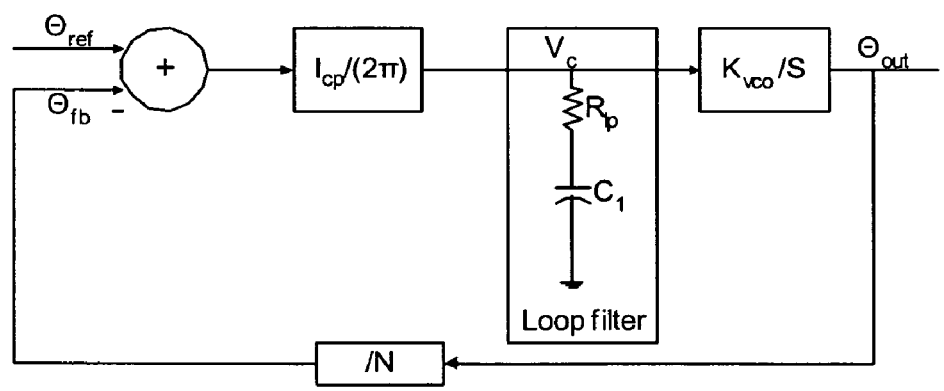

As shown in FIGS. 1 and 2, a typical conventional charge pump PLL includes a Phase Frequency Detector (PFD), a Charge Pump (CP), Low-Pass Filter (LPF), Voltage Controlled Oscillator (VCO) and Feedback Divider. The PFD conducts phase subtraction of input signals, with an output of corresponding signal up or dn. The control signals cause charge or discharge of Vc, and the VCO will generate a definite frequency after filtering by a loop filter. Generally speaking, on the feedback path, there will be a by-N divider, which allows frequency and phase to be divided by N, with the feedback being sent to the input of the PFD. After the phase is locked, the output frequency will be N times the input reference frequency.

A model of the charge pump PLL of FIG. 1 is shown in FIG. 2. The PLL may be modeled as a discrete-time system. After the phase is locked, there typically is little static phase error, such that the PLL is considered a linear system. When the loop bandwidth is far less than the input clock frequency, the average response of PLL over several clock periods can describe the system. Under such conditions, the PLL can be treated as a continuous-time system and can be analyzed with Laplace transforms. The phase discriminator PFD can be regarded as a phase subtractor; the charge pump may be described as a pure linear gain $I_{cp}/(2\pi)$, which transforms phase difference into current. The open-loop gain is the transfer function from the input along the loop to the feedback point:

$$T(s) = \frac{\Theta_{fb}}{\Theta_{ref}} = \frac{I_{cp}}{2\pi} \cdot Z_F(s) \cdot \frac{K_{VCO}}{s} \cdot \frac{1}{N} \quad (1)$$

In equation (1), $Z_F(s)$ is the impedance of low-pass filter, transforming current into voltage, and $K_{VCO}$ is the gain of VCO that takes rad/s/V as the unit. When using an impedance network including a series connection of resistance and capacitance, as shown in FIG. 1, $Z_F(s)$ can be written as:

$$Z_F(s) = \frac{1 + s \cdot R_{lp} \cdot C_1}{s \cdot C_1} \quad (2)$$

Substituting equation (2) into equation (1), the loop gain is a second-order system, with two poles and one zero. Their positions are given by the following formula:

$$p_1 = p_2 = 0 \quad (3)$$
$$z = -\frac{1}{R_{lp} \cdot C_1}$$

One pole is generated by integration from frequency to phase; the other is generated by the integration charge pump current by the loop capacitance. The frequency-to-phase integration enables the output frequency to accurately lock to the input clock, even if there is static phase contrast in the PLL. This is a characteristic of PLLs that differs from AFC. The integration gain of charge pump to capacitance at DC is generally infinite, which ensures that there is no static phase error.

To ensure some phase margin, usually the zero is chosen within the bandwidth. Assuming that the zero is far less than the bandwidth, then the bandwidth is approximately:

$$\omega_b = \frac{I_{cp}}{2\pi} \cdot R_{lp} \cdot \frac{K_{VCO}}{N} \quad (4)$$

The bandwidth should be far less than the angular frequency $\omega_{REF}$ of the input clock to meet the continuous-time approximation. Generally speaking, PLL bandwidth is less than 1/10 of the angular frequency of the input clock.

With the help of the loop-gain expression, other PLL equations can be deduced. The closed-loop transfer function of the negative feedback system can be given by forward gain divided by (1+loop gain):

$$H(s) = \frac{\frac{I_{cp}}{2\pi} \cdot K_{VCO} \cdot R_{lp} \cdot s + \frac{I_{cp}}{2\pi} \cdot \frac{K_{VCO}}{C_1}}{s^2 + \frac{I_{cp}}{2\pi} \cdot \frac{K_{VCO}}{N} \cdot R_{lp} \cdot s + \frac{I_{cp}}{2\pi} \cdot \frac{K_{VCO}}{N \cdot C_1}} \quad (5)$$

Comparing equation (5) with the standard second-order expression $$H(s) = A_0 \cdot \frac{2\zeta \cdot \omega_n \cdot s + \omega_n^2}{s^2 + 2\zeta \cdot \omega_n \cdot s + \omega_n^2}, \quad (6)$$

one may obtain:

$$\omega_n = \sqrt{\frac{I_{cp}}{2\pi} \cdot \frac{K_{VCO}}{N \cdot C_1}} \quad (7)$$

$$\zeta = \frac{1}{2}\sqrt{\frac{I_{cp}}{2\pi} \cdot \frac{K_{VCO}}{N} \cdot C_1} \cdot R_{lp} \quad (8)$$

$$A_0 = N \quad (9)$$

where $\omega_n$ is the natural angular frequency, and δ is the damping factor. Equation (9) indicates that the low-frequency phase gain of the frequency-doubled PLL is the frequency-doubled factor N. Comparing formulas (7), (8), and (4), the following may be obtained:

$$\omega_b = 2\zeta \cdot \omega_n \quad (10)$$

$$\zeta = \frac{1}{2}\sqrt{\omega_b \cdot R_{lp} \cdot C_1} \quad (11)$$

Corresponding transformations can be made among $\omega_b$, $\omega_n$ and $\delta$. If two of them are known, the third one can be deduced. From an analytical point of view, an analysis of two of the parameters is sufficient to know the characteristics of PLL.

Equation (1) indicates that a high-bandwidth PLL can use smaller capacitance than a low-bandwidth PLL to achieve the same damping. Moreover, a low-bandwidth PLL may be designed with a greater resistance to prevent the capacitance from being too large. When the bandwidth remains unchanged, large resistance means a greater phase noise. Therefore, the low-bandwidth PLL is a compromise between size, noise and performance.

The open-loop gain is of significance to the stability of the negative feedback system. As for the PLL, first, it should meet the continuous-time approximation, i.e. the angular frequency $\omega_b$ for the unit gain should not be more than 1/10 of the angular frequency of an input clock. Second, enough phase margin should be provided. In the transient process, the damping factor $\delta$ should be more than 0.5 to avoid excessive phase overshoot. There may be other requirements.

Figure 3:
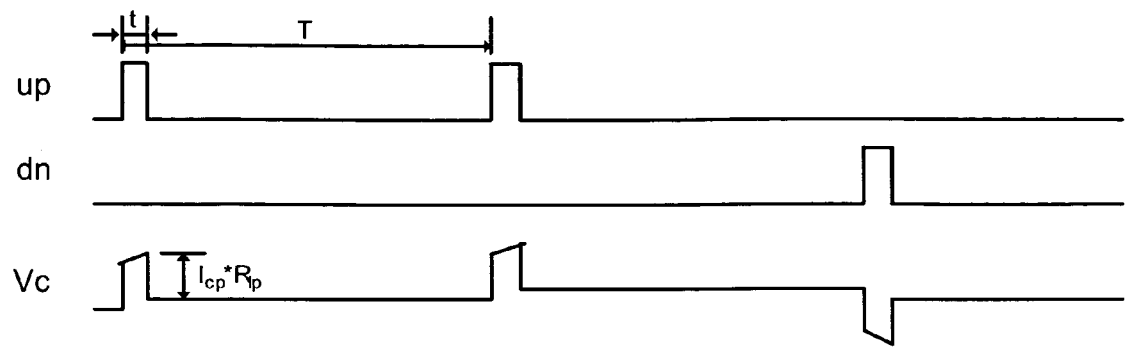
FIG. 3 illustrates exemplary operations of the PLL of FIGS. 1 and 2.

The above discussion deals with the basic continuous-time approximation, which means the average response for several clock periods. The transient response of each phase discriminator cycle is illustrated in FIG. 3. When the phase discriminator asserts the "up" signal, Vc exhibits a corresponding response. When the charge current flows, Vc exhibits a positive jump relatively immediately, with the jump amplitude equal to $I_{cp}*R_{lp}$. Because the $R_{lp}C_1$ time constant is much greater than pulse width "t", the subsequent response equals to charging capacitance $C_1$ with constant current $I_{cp}$, which means that the waveform is a substantially straight line with a slope of $I_{cp}/C_1$. When the charging period is over, Vc will substantially immediately generate a negative jump, with an amplitude equal to $I_{cp}*R_{lp}$. Then Vc will hold substantially constant until the next "up" or "dn" signal. It can be seen from the above analysis that the existence of resistance can cause Vc to generate $I_{cp}*R_{lp}$ ripples. For frequency-doubled PLL, this ripple may make the output clock frequency uneven, which may cause jitter.

Figure 4:
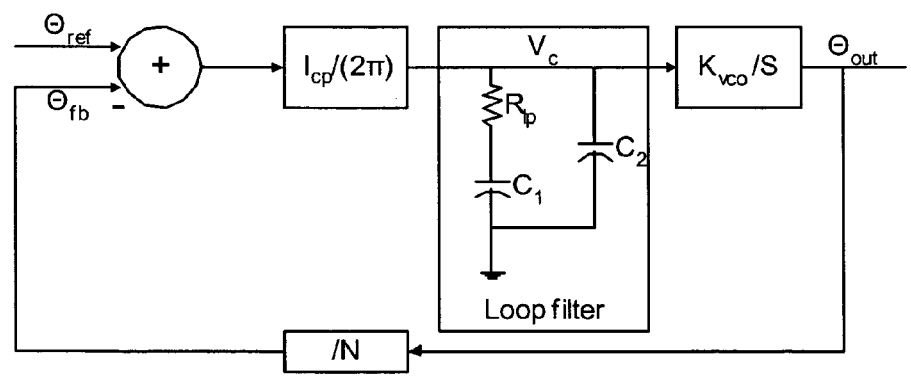
FIG. 4 illustrates another conventional PLL.
Figure 5:
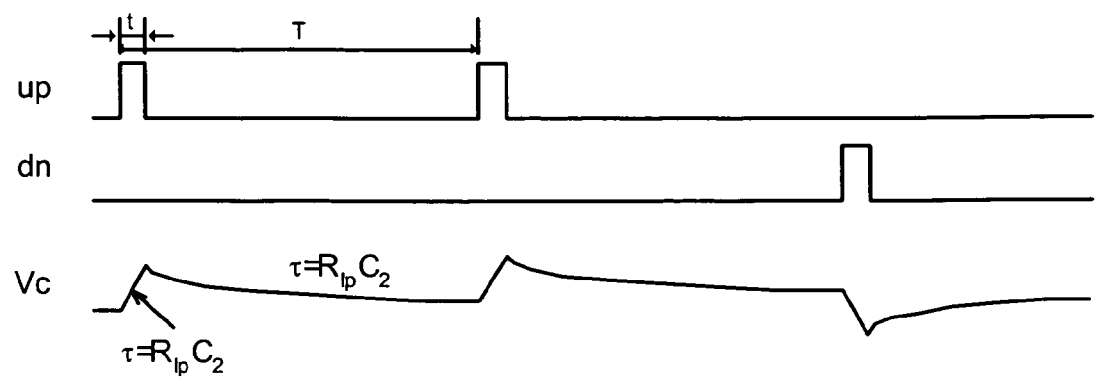
FIG. 5 illustrates exemplary operations of the PLL circuit of FIG. 4.

In circuit realizations, second-order or even higher-order filters may be used to reduce Vc ripples. FIG. 4 illustrates a model of a third-order PLL, adopting a second-order loop filter. There is a small capacitance in parallel connection with Vc, which may effectively reduce the height of ripples. During the charge period t, because time t is far less than time constant $R_{lp}C_2$, there is a less abrupt voltage jump, i.e., a rise at an approximate rate of $I_{cp}/C_2$. After the charge period is over, Vc discharges according to time constant $R_{lp}*C_2$, due to basically no charge being delivered into $C_1$, as shown in FIG. 5. For stability, $C_2$ should be far less than $C_1$.

With the small capacitance $C_2$, the impedance of the low-pass filter may be written as:

$$Z_F(s) = \frac{1}{s \cdot (C_1 + C_2)} \cdot \frac{1 + s \cdot R_{lp} \cdot C_1}{1 + s \cdot R_{lp} \cdot \frac{C_1 C_2}{C_1 + C_2}} \quad (12)$$

Equation (12) shows that a pole is actually added to the loop impedance, which is determined by the product of $R_{lp}$ times the series connection of $C_1$ and $C_2$:

$$p_3 = -\frac{1}{R_{lp} \cdot \frac{C_1 C_2}{C_1 + C_2}} \quad (13)$$

Generally, the third pole may be several times greater than the bandwidth so that the phase margin is not very small. With the third pole, the closed-loop transfer function is more complicated:

$$H(s) = \frac{\Theta_{out}}{\Theta_{ref}} = \frac{\frac{I_{cp}}{2\pi} \cdot K_{VCO} \cdot R_{lp} \cdot C_1 \cdot s + \frac{I_{cp}}{2\pi} \cdot K_{VCO}}{R_{lp} \cdot C_1 \cdot C_2 \cdot s^3 + (C_1 + C_2) \cdot s^2 + \frac{I_{cp}}{2\pi} \cdot \frac{K_{VCO}}{N} \cdot R_{lp} \cdot C_1 \cdot s + \frac{I_{cp}}{2\pi} \cdot \frac{K_{VCO}}{N}} \quad (14)$$

Compared with equation (5), the numerator remains unchanged, while the denominator has become a cubic polynomial. To determine where the pole will be located when the loop is closed, the cubic equation for the denominator may be solved. In fact, for different circuit design parameters, there will be various possible pole positions. From open-loop pole positions with feedbacks from different depths, different positions for closed-loop poles may be obtained.

Figure 6:
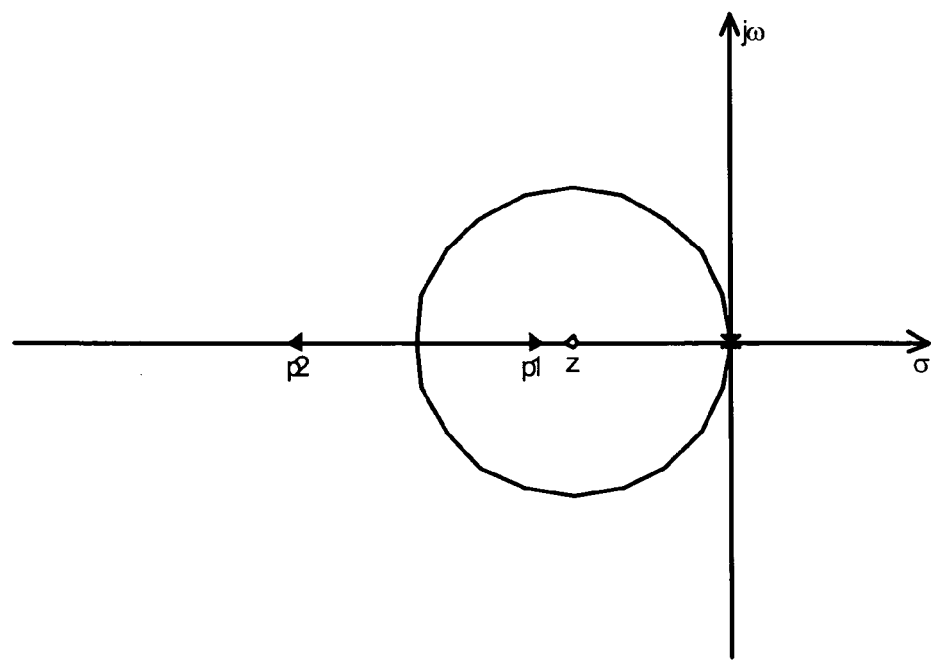
FIGS. 6-8 illustrate root locus characteristics for a conventional PLL circuit.

A root locus diagram is an effective method to analyze the stability. As shown in FIG. 6, the zero-pole position at open loop is obtained from equation (3). At closed loop, with the zero remaining fixed, the two poles at the origin will separate and move around the zero. When they meet again on the real axis, they will be apart again, with one of them moving towards the zero, and the other moving in the opposite direction. The constant term of loop gain equation (1) determines the final positions of the poles.

Figure 7:
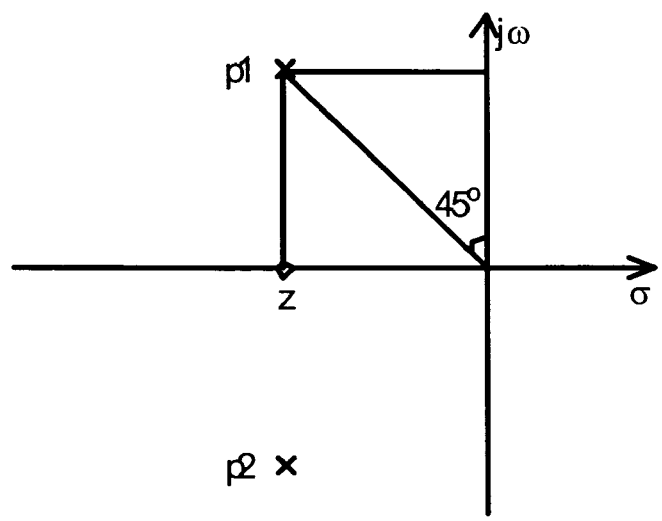
Figure 8:
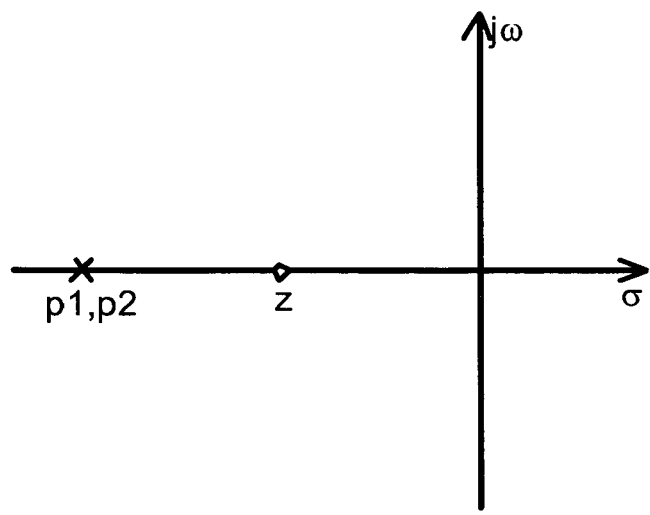

FIGS. 7 and 8 show the corresponding zero-pole diagrams for different damping factors after the second-order PLL is closed. When the two poles moves to a position which has an angle of ±45° with respect to the origin, the relationship between the zero and the natural angular frequency is that the zero is equal to $(-\omega_n/\sqrt{2})$, because the distance from the poles to the origin is the natural angular frequency. The real parts of the poles and the zero are equal, and the damping factor is 0.707. When the two poles meet again on the real axis, the zero is equal to $(-\omega_n/2)$, and the damping factor is 1. When the poles are apart, the ratio of distances from them to the origin is the damping factor.

Figure 9:
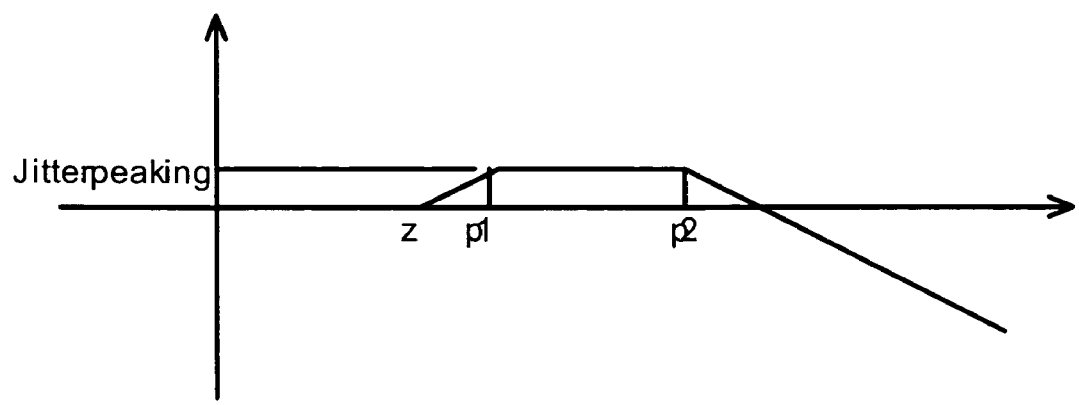
FIG. 9 illustrates a Bode plot for a conventional PLL circuit.
Figure 10:
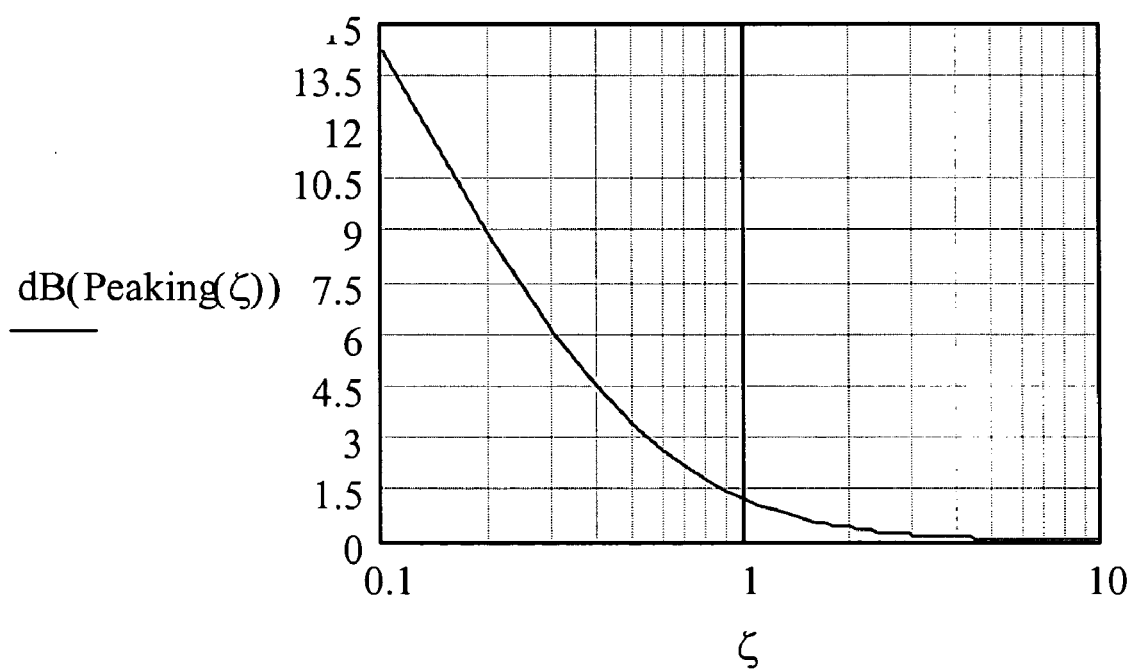
FIG. 10 illustrates jitter peaking characteristics for a conventional PLL.

A closed-loop-response Bode diagram can be worked out according to the closed-loop zero-pole diagram. If the pole moves to the arrow position on FIG. 8, the Bode diagram will be as that shown in FIG. 9. No matter how large the constant term of loop gain is, the zero is always in the front of the first pole after the loop is closed. Therefore, the maximum amplitude response will be greater than 0 dB. This phenomenon is called jitter peaking. If the damping factor δ is an independent variable, the waveform of second-order PLL jitter peaking may be as shown in FIG. 10. When the damping factor δ is very small (δ<0.707), both the poles and the zero contribute to the jitter peaking. When the damping factor is more than 1, the distance between the zero and the first pole, after the loop is closed, determines how large the jitter peaking can be. To reduce the jitter peaking, a greater damping factor may be used. Here, the zero and the first point are close enough so as to be regarded as being equal. Thus the −3 dB bandwidth, after the loop is closed, is almost equal to the frequency of the second pole, i.e., the zero frequency multiplied by the damping factor.

Figure 11:
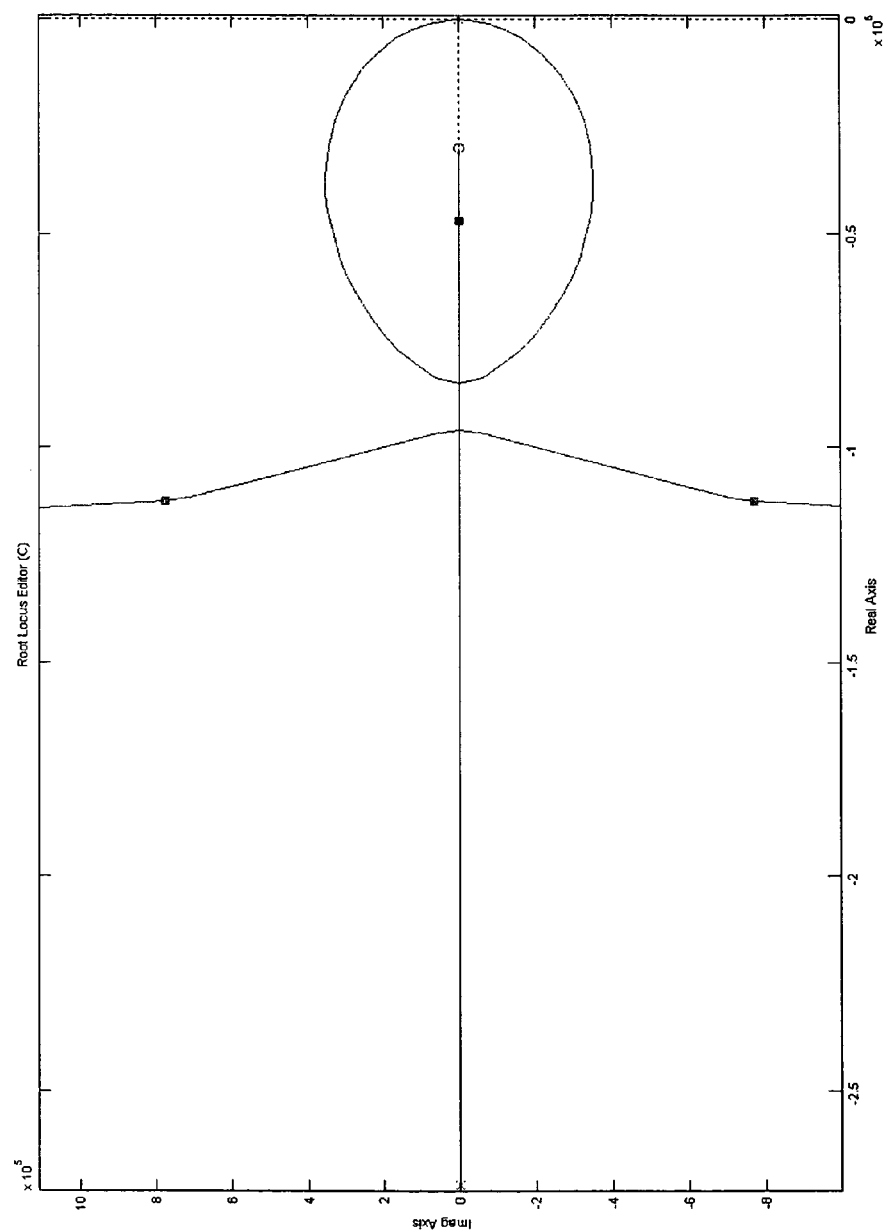
FIG. 11 illustrates root locus characteristics for a conventional PLL.

As for the third-order PLL, if the third pole is not far enough, the root-locus chart may appear as that in FIG. 11. In the chart, under the influence of the third pole, the circular motions of the first and the second poles are distorted. The second pole and the third pole meet each other on the real axis, then separate and become a pair of conjugate poles. The line between the pair of conjugate poles forms an angle of 90° with the real axis. If the loop gain is great enough, this pair of conjugate poles can also produce the peaking in Bode plots. By designing the third pole to be far away, this kind of situation may be avoided.

In systems susceptive to jitter peaking, a greater damping factor may be desirable. Equation (11) indicates that a large damping factor can be realized with high bandwidth, large resistance or large capacitance. In real applications, there may be specific requirements on the bandwidth. If the bandwidth is not high, either resistance or the capacitance may be made large. A potential problem with using a large resistance is noise, and a potential problem with using a large capacitance is chip area. Ways to avoid such problems have been developed. A structure for a PLL for clock data recovery is described in T. H. Lee and J. F. Bulzacchelli, "A 155-MHz clock recovery delay- and phase-locked loop," *IEEE Journal of Solid-State Circuits*, vol. 27, pp. 1736-1746, December 1992, which makes a closed loop transfer function of a PLL present all-pole characteristics, which may significantly reduce jitter peaking. A common approach is to enlarge the loop equivalent resistance without increasing the noise correspondingly. A dual path realization of a loop zero is described in J. Craninckx and M. Steyaert, "A fully integrated CMOS DCS-1800 frequency synthesizer," *IEEE Journal of Solid-State Circuits*, vol. 33, pp. 2054-2065, December 1998. In similar noise performance situations, the equivalent resistance can be greater, reducing the capacitance (or the realization of less noise than common practice when capacitance remains the same). A similar sampling—reset technique for a PLL is proposed in A. Maxim, B. Scott, E. M. Schneider, M. L. Hage, S. Chacko, and D. Stiurca, "A low-jitter 125-1250-MHz process-independent and ripple-poleless 0.180-um CMOS PLL based on a sample-Reset loop filter," *IEEE Journal of Solid-State Circuits*, vol. 36, pp. 1673-1683, November 2001. According to this technique the loop resistance is replaced with a switched capacitor, which may reduce ripple produced by the resistance and reduce requirements on the high stage poles.

Advantages of replacing the loop resistance with a switched capacitor may be explained with reference to FIG. 3. Changes in the mean value of Vc in a phase detector cycle $T_{REF}$ include a resistance effect $[\Delta V_{RES}]$ and a capacitance effect $[\Delta V_{CAP}]$. Referring to FIG. 3, by averaging the ripple area produced by the resistance on the entire cycle $T_{REF}$, the mean value $[\overline{\Delta V_{RES}}]$ may be determined:

$$\overline{\Delta V_{RES}} = \frac{I_{cp} \cdot R_{lp} \cdot t}{T_{REF}} \quad (15)$$

The mean value of the capacitance effect $[\overline{\Delta V_{CAP}}]$ can be obtained in a similar manner:

$$\overline{\Delta V_{CAP}} = \frac{\frac{I_{cp} \cdot t \cdot T_{REF}}{C_1} - \frac{1}{2} \cdot \frac{I_{cp} \cdot t^2}{C_1}}{T_{REF}} = \frac{I_{cp} \cdot t}{C_1} - \frac{1}{2} \cdot \frac{I_{cp} \cdot t^2}{T_{REF} \cdot C_1} \quad (16)$$

Figure 12:
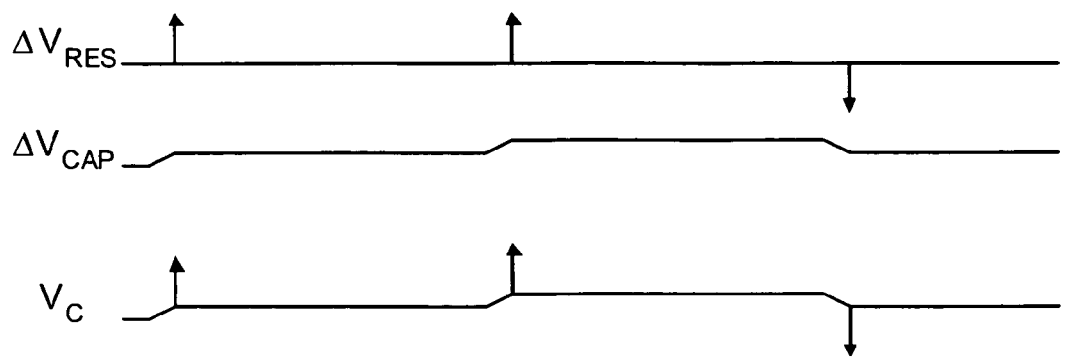
FIGS. 12-14 illustrate sampling behavior of a conventional PLL.
Figure 13:
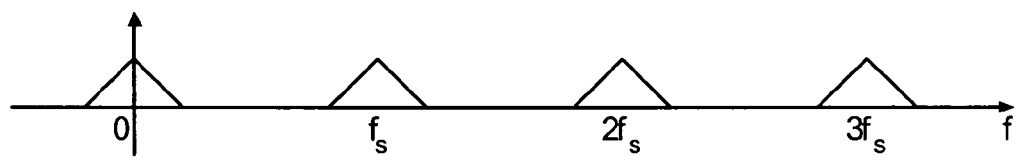
Figure 14:

When the PLL is locked, the pulse width of the signals up and dn is very small, i.e., the pulse width t may be far smaller than phase detector cycle $T_{REF}$. The resistance and the capacitance effects can be considered as sampling. Referring to FIGS. 12-14, sampling appears in the frequency domain as repeating in the sampling frequency n harmonic (FIG. 13), while sample-and-hold also has a zero-order hold effect, namely the frequency spectrum (FIG. 13) multiplied by $$\left[\sin\left(\frac{\pi \cdot f}{f_s}\right) \middle/ \frac{\pi \cdot f}{f_s}\right]$$

(FIG. 14).

The resistance sampling effect and the capacitance sampling—maintenance effect work at the same time, leading to a question as to which one is dominant. Comparing their mean value, the zero is smaller than the bandwidth, while the bandwidth is far smaller than the operating frequency, namely $$\left[\frac{1}{2\pi \cdot R_{lp} C_1} < f_b \ll \frac{1}{T_{REF}}\right]. \text{ Then } \left[\frac{1}{R_{lp} C_1} \ll \frac{1}{T_{REF}}\right].$$

Putting these into equations (15) and (16) yields:

$$\overline{\Delta V_{RES}} \gg \overline{\Delta V_{CAP}} \quad (17)$$

In this case, the resistance sampling effect is the dominant part of the Vc change. Therefore, if the resistance sampling effect also has the zero-order hold effect, it may be helpful in reducing the high frequency stray spectrum, and in reducing jitter.

Figure 15:
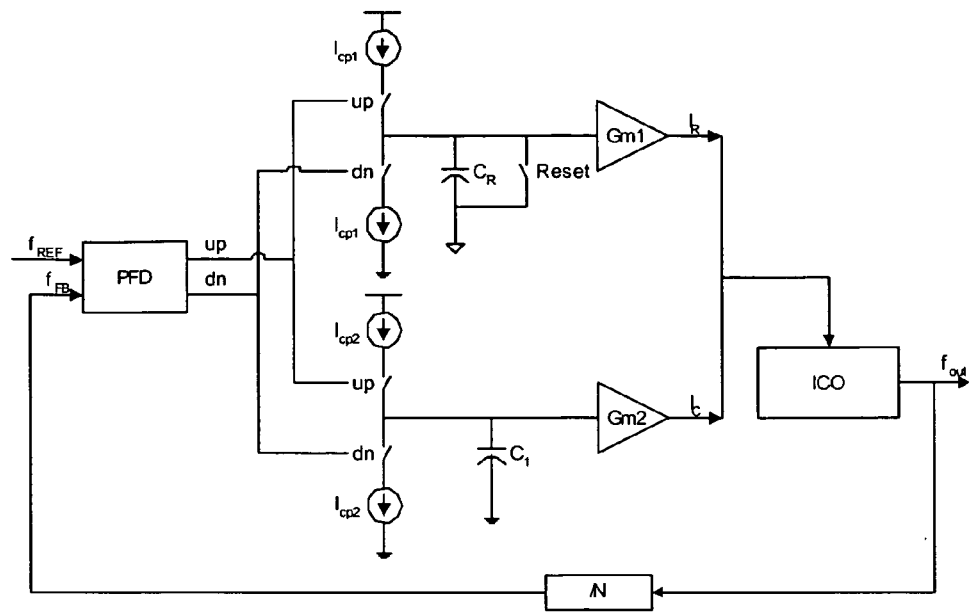
FIGS. 15 and 16 illustrate conventional sampling—restoration PLLs.

A conventional sampling—reset PLL is shown in FIG. 15. The resistance (switched capacitor $C_R$) and capacitance $C_1$ run in different routes. After transforming to the electric current, they are added together to control the current controlled oscillator (ICO). The equivalent loop resistance is the function of the phase detecting frequency and the capacitance:

$$R_{equ} = \frac{1}{f_{REF} C_R} \cdot \frac{I_{CP1}}{I_{CP2}} \cdot \frac{G_{m1}}{G_{m2}} \quad (18)$$

This equivalence can be obtained by making the mean values in a cycle equal to each other. Running two routes increase the freedom of design. The electric current in the two charges pump and the gain $G_m$ of the voltage to the current can all be different. Make the $I_{CP1}$ greater, the capacitance becomes greater, which can reduce the equivalent noise $kT/C_R$ of $C_R$. In fact, a real circuit typically cannot achieve the ideal reset. It only means $I_R$ has a DC component all the time. This DC component may be designed to be small enough because it reduces the tuning range of the current controlled oscillator (ICO), and it increases the variation of the gain $K_{ico}$. Equation (18) may grant the designer freedom to make the loop resistance large, so that the peaking in the closed loop transfer function can be reduced. But, a potential problem with the circuit of FIG. 15 is that there may not be enough time for reset.

Figure 16:
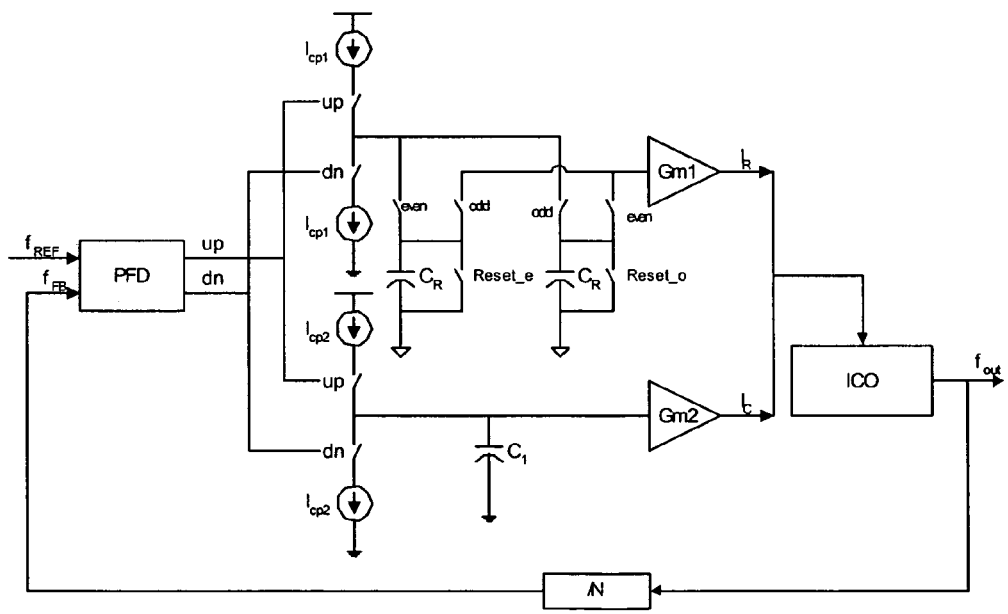

FIG. 16 illustrates a modification, using two sets of switched capacitors to equal the loop resistance, described in A. Maxim, B. Scott, E. M. Schneider, M. L. Hage, S. Chacko, and D. Stiurca, "A low-jitter 125-1250-MHz process-independent and ripple-poleless 0.180-um CMOS PLL based on a sample-Reset loop filter," *IEEE Journal of Solid-State Circuits*, vol. 36, pp. 1673-1683, November 2001. The two sets of switched capacitors work in turns. While one set is charging and discharging, the other set sends the result of last discharge to the next stage. The reset time equals to an entire operating cycle. Other solutions are described in John G. Maneatis, Jaeha Kim, Iain McClatchie, Jay Maxey and Manjusha Shankaradas, "Self-Biased High-Bandwidth Low-Jitter 1-to-4096 Multiplier Clock Generator PLL," *IEEE Journal of Solid-State Circuits*, vol. 38, pp. 1797-1803, November 2003.

Figure 17:
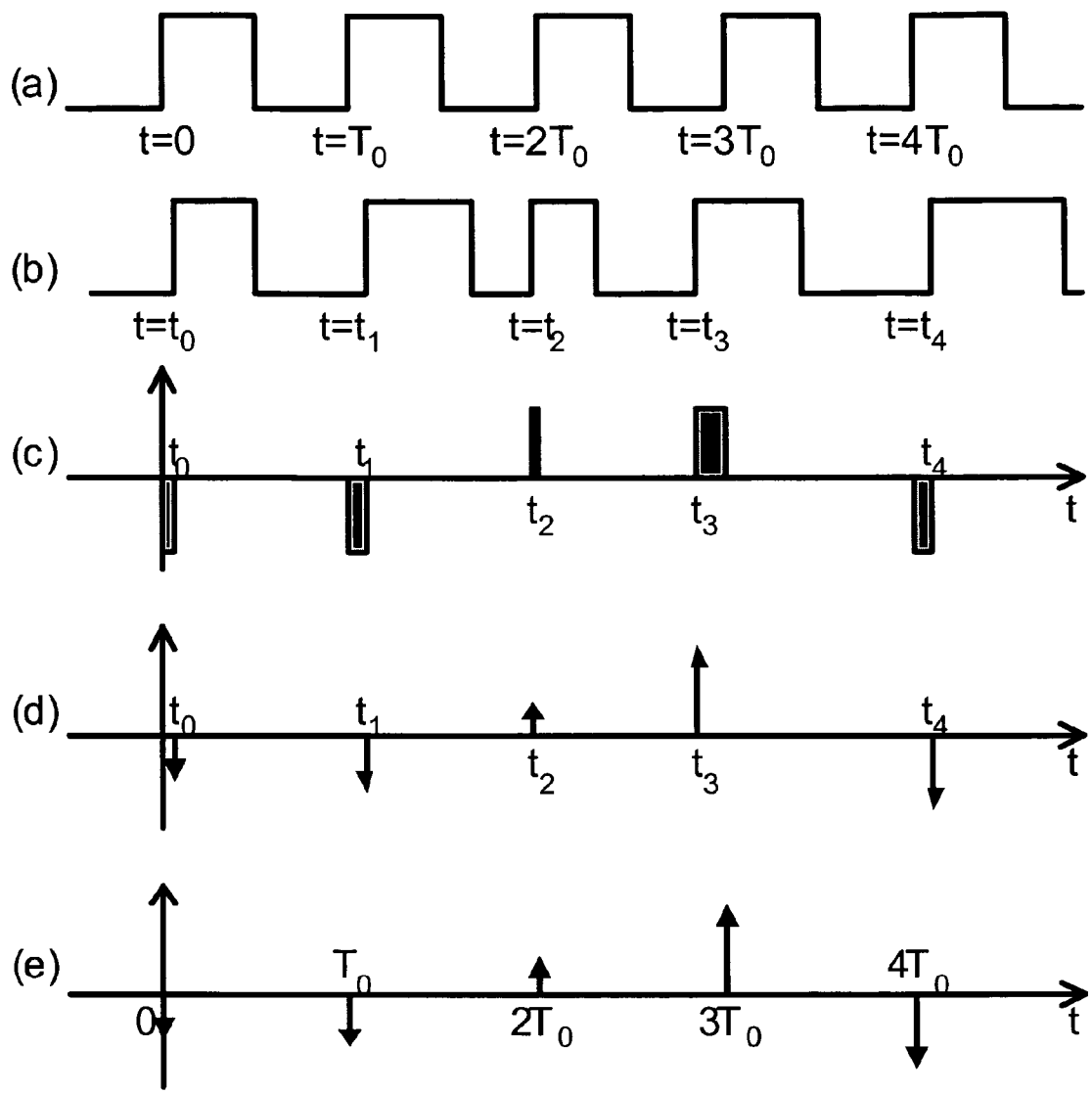
FIG. 17 illustrates operations of the PLL of FIG. 16.

An ideal clock has a frequency of $f_0$ and a cycle of $T_0$ ($T_0=1/f_0$): at the time of 0 there is a rising edge, and there is a rising edge again at the time $T_0$. Again there are rising edges at the time $2T_0$, $3T_0$ . . . as is shown in FIG. 17(a). There is another same-frequency clock with jitter. Its closest rising edges appear in the time of $t_1$, $t_2$, $t_3$, $t_4$, $t_5$ as showed in FIG. 17(b). Then, the jitter, also known as the error between rising edge and the ideal clock, are respectively $t_1$, $t_2$—$T_0$, $t_3$—$2T_0$, $t_4$—$3T_0$, $t_5$—$4T_0$. FIG. 17(c) shows the result by pulse width. In the figure, lagging behind the phase of the ideal clock is defined as negative, while leading is defined as positive. Usually, jitter is far smaller than the clock cycle $T_0$, namely, the jitter pulse width is small such that the pulse width can be regarded as the impulse function. The height of each impulse equals to the pulse width, and lies at the corresponding time, as illustrated in FIG. 17(d). In this way, a non-uniform sampled jitter is produced, which is hard to analyze. The sampling time can be approximately moved to the integral multiple cycle to thereby obtain the jitter sequence of the uniform sampled by the frequency of $f_0$ as showed in FIG. 17(e). This jitter is known as the phase jitter. It is also known as time interval error (TIE), tracking jitter, absolute jitter, and long term jitter.

Phase jitter may be expressed as follows:

$$t_{phase-jitter} = t_n - nT_0 \qquad (19)$$

The relationship of the phase and the time may be expressed as follows:

$$\Theta = \omega \cdot t = \frac{2\pi}{T_0} \cdot t, \qquad (20)$$

i.e., time $T_0$ corresponds with phase $2\pi$, and the time $2T_0$ corresponds with phase $4\pi$, while the time $3T_0$ corresponds with phase $6\pi$. Thus, the phase noise and the phase jitter may be related to each other in the following way:

$$\Theta_n = 2\pi \cdot \frac{t_{phase-jitter}}{T_0} \qquad (21)$$

The phase jitter shown in FIG. 17(e) may also stand for the phase noise, with a gain of $2\pi/T_0$.

Figure 18:
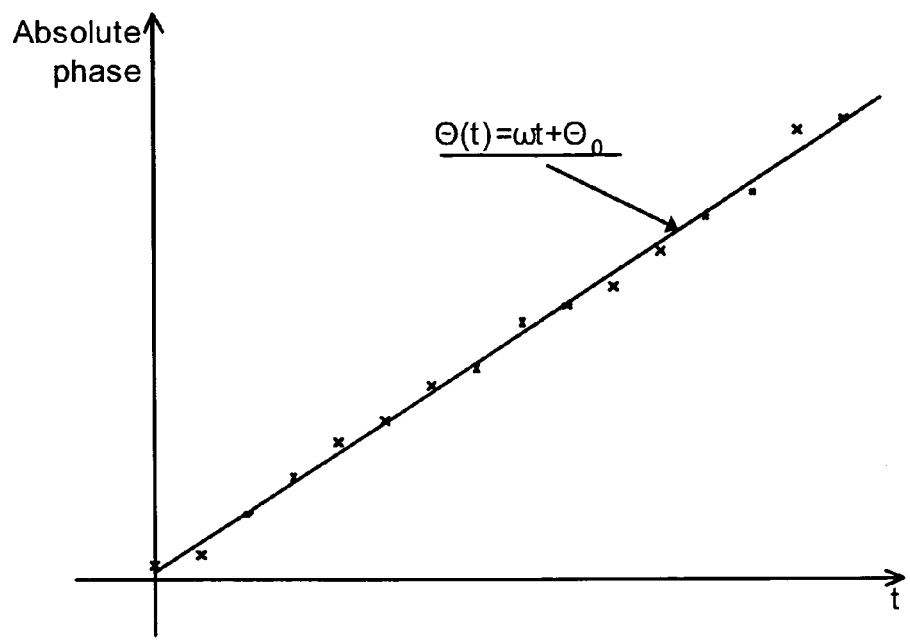
FIG. 18 illustrates jitter behavior of the PLL of FIG. 16.

A same-frequency ideal clock may be used to determine clock jitter. This ideal clock usually approximates from the clock to be analyzed in practical applications. A least squares method may be used to determine [$\Theta(t)=\omega \cdot t+\Theta_0$]. The $\omega$ in the formula is the average frequency of the clock and the $\Lambda_0$ is the initial phase. Each time when the clock to be analyzed rises, it is $2n\pi$ to the phase and distributes near the straight line shown in FIG. 18.

Jitter may also be calculated without an ideal clock. If the position of each rising edge is known, the instantaneous cycle $T(t)$ may be determined. How much the instantaneous cycle deviates from the ideal cycle also indicates the jitter. This may be referred to as period jitter or cycle jitter:

$$T_1 = t_1 - t_0, \ T_2 = t_2 - t_1, \ T_3 = t_3 - t_2, \qquad (22)$$

If the ideal cycle is $T_0$, then the period jitter or cycle jitter is:

$$t_{period-jitter} = T_n - T_0 \qquad (23)$$

Combining the instantaneous cycle equation (23) yields:

$$T_1 - T_0 = t_1 - t_0 - T_0 = (t_1 - T_0) - t_0$$

$$T_2 - T_0 = t_2 - t_1 - T_0 = (t_2 - 2T_0) - (t_1 - T_0) \qquad (24)$$

$$T_3 - T_0 = t_3 - t_2 - T_0 = (t_3 - 3T_0) - (t_2 - 2T_0)$$

This may be generalized to:

$$t_{period-jitter_n} = t_{phase-jitter_n} - t_{phase-jitter_{n-1}} \qquad (25)$$

The period jitter or cycle jitter is the differential of phase jitter. Accordingly, we can infer that the phase jitter is the integral of the period jitter or cycle jitter. Because it is the integral, it may lack a constant term, which is the initial phase of the clock. This does not affect each frequency component of the jitter, but may influence the root-mean-square (rms) value. So, usually after integration, the mean value may be subtracted from each sample to eliminate the influence of the initial phase.

Another jitter is cycle-to-cycle jitter, i.e., the changes of neighboring cycles. The cycle-to-cycle jitter may be expressed as:

$$t_{c2c-jitter} = T_{n+1} - T_n \qquad (26)$$

The cycle-to-cycle jitter is the differential of cycle jitter, while the cycle jitter is the integral of cycle-to-cycle jitter.

The relationships among the three kinds of different jitter may be extremely important. If the sampling frequency changes, it should be normalized to the sampling frequency to carry on the calculations of integrals and differentials. In the frequency domain, the integrals are low-pass, while the differentials are high-pass. Compared with the phase jitter, there are two differentials in the cycle-to-cycle jitter, which means a enlarged high frequency component and suppressed low frequency component. So, the cycle-to-cycle jitter is generally sensitive to high frequency noise. Low-frequency noise may cause large phase jitter, while hardly affecting the cycle to the cycle jitter. This may be understood by contrast to a sampling system. When sampling a low-frequency signal, if the sampling rate is very high (i.e., the ratio of the sampling frequency to the signal frequency is very large), the differences between every two samplings may be very small.

Some assign phase jitter to the time domain and phase noise to the frequency domain because the clock jitter is often expressed in terms of unit interval (UI), while the phase noise often uses the unit of dBc. However, clock jitter and phase noise may both be viewed as sampling sequences in the time domain. Carrying out a discrete Fourier transform (DFT) on them, frequency domain expressions may be obtained.

Because a square-wave signal generally contains rich spectral content, a sine wave [A sin [$\omega_c$·t+b cos($\omega_m$·t)]] with single frequency phase noise will be considered. It is a phase modulation wave. A is the sine wave magnitude. $\omega_c$ is the carrier wave frequency, while b and $\omega_m$ are respectively the modulation signal (namely phase noise) magnitude and frequency. Assuming b is far smaller than $2\pi$ (a narrow-band approximation), the calculation according to the triangle formula yields:

$$A \cdot \sin(\omega_c \cdot t + b \cdot \cos(\omega_m \cdot t)) = A \cdot \sin(\omega_c \cdot t) \cdot \cos(b \cdot \cos(\omega_m \cdot t)) + \quad (27)$$
$$A \cdot \cos(\omega_c \cdot t) \cdot \sin(b \cdot \cos(\omega_m \cdot t))$$
$$\approx A \cdot \sin(\omega_c \cdot t) + A \cdot \cos(\omega_c \cdot t) \cdot$$
$$b \cdot \cos(\omega_m \cdot t)$$
$$= A \cdot \sin(\omega_c \cdot t) + \frac{1}{2} \cdot A \cdot b \cdot \cos(\omega_c - \omega_m)$$
$$t + \frac{1}{2} \cdot A \cdot b \cdot \cos(\omega_c + \omega_m)t$$

Figure 19:
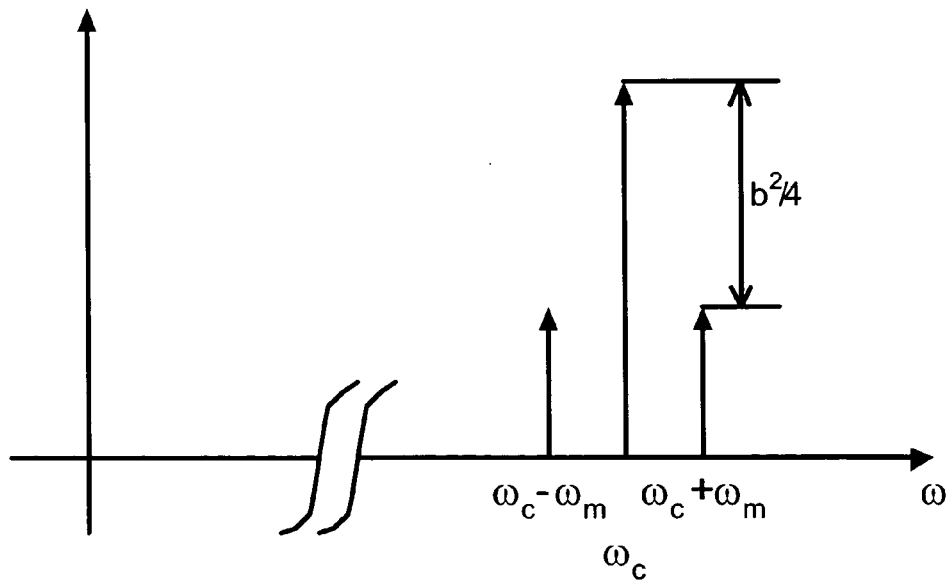
FIG. 19 illustrates power spectrum of a single frequency phase modulation vibration wave of a conventional PLL.

Calculating according to the narrow-band approximation, the power spectrum of a single frequency phase modulation vibration wave contains a carrier wave band at $\omega_c$ and two side bands located in both sides of the carrier wave at respective distances equal to the modulation frequency $\omega_m$, as shown in FIG. 19. dBc is the ratio of noise showed in the form of decibel to carrier wave power. In the narrow-band approximation, it is 10 log($b^2$/4). As a rule, narrow-band approximation can describe the phase noise of oscillator or PLL precisely. But in certain applications, if the coefficient of modulation is very large such as the spread-spectrum clock or frequency modulation (FM), a Bessel function of the first kind may be used to determine the energy of each spectral component.

Figure 20:
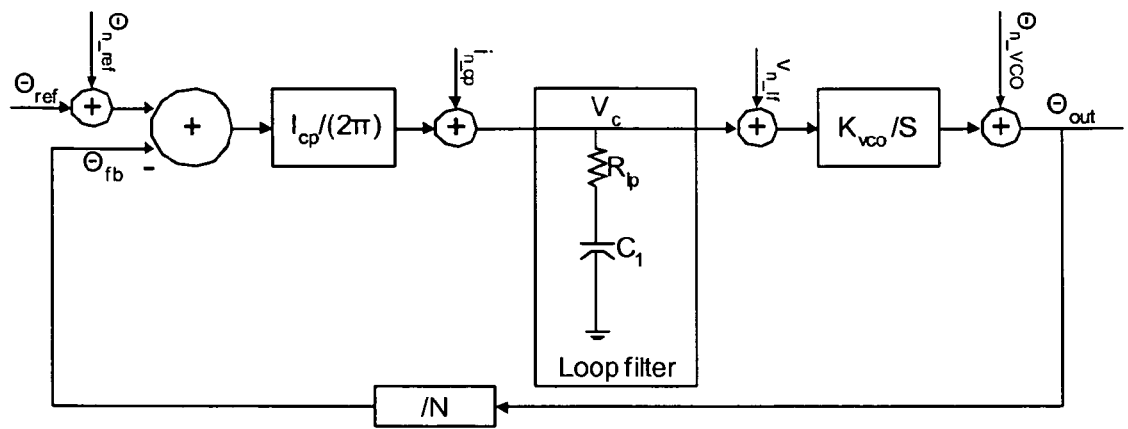
FIG. 20 illustrates a noise model of a conventional PLL.

FIG. 20 shows a noise model of a second-order charge pump PLL. $\theta_{n-ref}$ represents jitter of the input clock. The current supply of the charge pump contains $i_{n-cp}$ noise current, with the loop filter resistance noise shown as $V_{n-lf}$. The VCO output superimposes the phase noise $\theta_{n-VCO}$. Since the frequency divider's input and output are all digital signals and the electrical level change is extremely steep, the noise voltage falls in the steep border and the jitter introduced may be neglected. In this way, the PLL is modeled by the noise source and noiseless modules.

Combining with the loop equation described in equation (1), a transfer function of each noise source to output phase may be obtained:

$$H(s)_{in} = \frac{\Theta_{out}}{\Theta_{n\_ref}} = N \cdot \frac{2\zeta \cdot \omega_n \cdot s + \omega_n^2}{s^2 + 2\zeta \cdot \omega_n \cdot s + \omega_n^2} \quad (28)$$

$$H(s)_{cp} = \frac{\Theta_{out}}{i_{n\_cp}} = \frac{\frac{1 + s \cdot C_1 \cdot R_{lp}}{C_1} \cdot K_{VCO}}{s^2 + 2\zeta \cdot \omega_n \cdot s + \omega_n^2} \quad (29)$$

$$H(s)_{lf} = \frac{\Theta_{out}}{v_{n\_lf}} = \frac{K_{VCO} \cdot s}{s^2 + 2\zeta \cdot \omega_n \cdot s + \omega_n^2} \quad (30)$$

$$H(s)_{VCO} = \frac{\Theta_{out}}{\Theta_{n\_VCO}} = \frac{s^2}{s^2 + 2\zeta \cdot \omega_n \cdot s + \omega_n^2} \quad (31)$$

It may be inferred from these equations that jitter of input clock and current source noise to output are both low-pass responses. Their low frequency gains are respectively N and $N/(I_{cp}/2\pi)$. Their low frequency gains are different because they are provided from different places and there is a gain stage ($I_{cp}/2\pi$) difference. The filter noise to the output is band-pass response, while the noise superimposed after VCO is high-pass response.

As for the jitter of the input clock, the PLL appears as low pass with peaking, which can filter out the high frequency jitter of the input clock. With the jittery input clock, like in a clock data recovery circuit, there may be relatively low requirements on the bandwidth of the PLL. In frequency synthesizer applications, it may be assumed that the jitter of the input clock is small. For example, taking a crystal oscillator as the reference clock, the bandwidth should be quite high to suppress the jitter of PLL itself. An exception is the $\Sigma$-$\Delta$ fraction-N frequency synthesizer. The loop filter is to filter out the quantization noise s produced by [$\Sigma$-$\Delta$] modulation and the spurious tones. In such a case, the bandwidth should not be made high.

To understand the PLL low frequency gain N to the input jitter, assume a low-frequency single frequency modulation jitter, the size of which is J seconds. To illustrate the effect of a frequency-multiplying PLL, it may be first converted into phase noise:

$$\Theta_{n\_ref} = \frac{J}{T_{REF}} \cdot 2\pi \quad (32)$$

Very low-frequency single frequency modulation allows considering only the PLL low frequency gain N and an ignoring the jitter peaking, such that:

$$\Theta_{out} = \frac{J}{T_{REF}} \cdot 2\pi \cdot N \quad (33)$$

Converting the output phase noise into jitter applying the formula $T_{REF} = N \cdot T_{out}$:

$$jitter_{out} = \frac{\Theta_{out}}{2\pi} \cdot T_{out} = J \quad (34)$$

Figure 21:
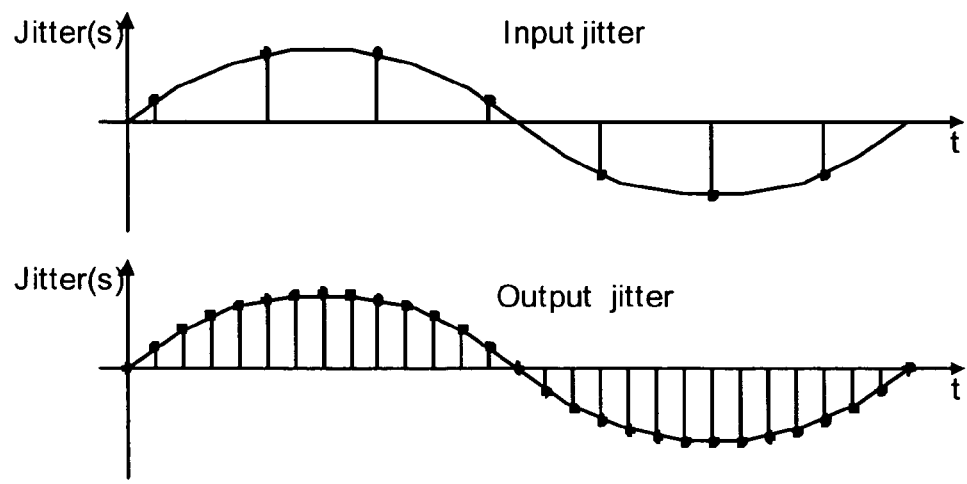
FIG. 21 illustrates jitter behavior of a conventional PLL.

Although the phase noise is magnified N times, if the units are seconds, the output jitter is substantially the same as the input jitter. The result is reasonable, that is the time error will not be magnified. In other words, the phase noise is enlarged N times with the same time error in terms of output frequency. FIG. 21 shows an example of input and output jitter in 4-frequency multiplication. In fact, the frequency-multiplying PLL equals to having done the up sampling effect.

As for the noise of the loop filter, to determine the band-pass response scope peak value of equation (30), s may be replaced with jω to obtain:

$$Mag = \left| \frac{K_{VCO} \cdot j\omega}{-\omega^2 + 2 \cdot \zeta \cdot \omega_n \cdot j\omega + \omega_n^2} \right| \quad (35)$$

$$= \frac{K_{VCO} \cdot \omega}{\sqrt{(\omega_n^2 - \omega^2)^2 + (2 \cdot \zeta \cdot \omega_n \cdot \omega)^2}}$$

The maximum value occurs where the first stage derivative is zero. Carrying out the calculation for the derivative of the above formula ω and making it zero, after solving the equation, the maximum value if the bandpass response is:

$$Mag_{\max} = \frac{K_{VCO}}{\omega_b} = \frac{2\pi}{I_{cp}} \cdot \frac{N}{R_{lp}} \quad (36)$$

This indicates that, to reduce the impact of noise of the filter, the gain of the VCO may be reduced or the bandwidth increased. In other words, current $I_{cp}$ of the charge pump or resistance $R_{lp}$ of the filter may be increased. Although the noise power of the loop resistance is $4KTR_{lp}$, enlarging the resistance may increase the noise source, but the effect to output phase noise is reduced. Because the maximum bandpass response appears at $\omega_n$, a substantially similar effect may be achieved by increasing the natural frequency.

Figure 22:
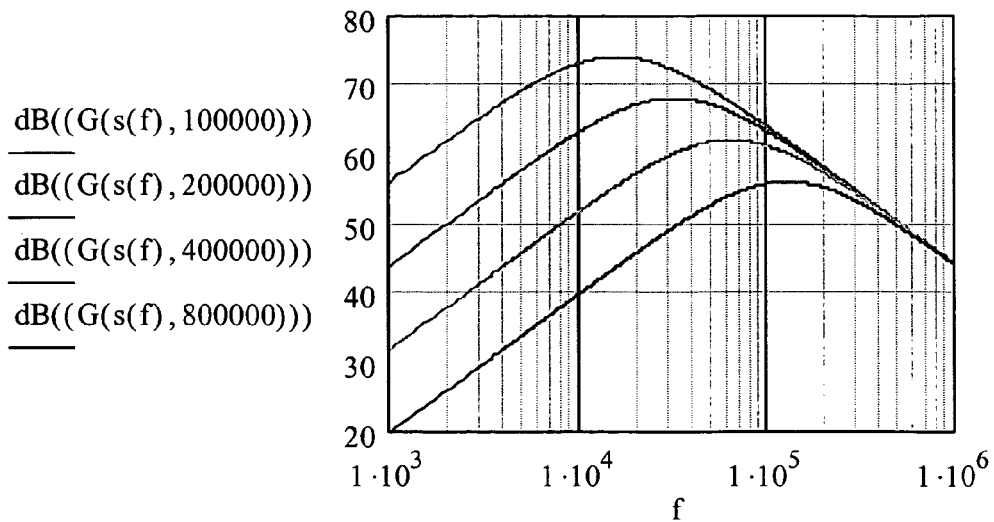
FIG. 22 illustrates jitter peaking behavior of a conventional PLL.

FIG. 22 shows the amplitude response of the filter noise to output by increasing $\omega_n$ when the damping factor remains unchanged. In the figure, curves for 100 krad/s, 200 Krad/s, 400 Krad/s and 800 Krad/s values for $\omega_n$ are shown. As the natural frequency increases, not only does the scope peak value of the band-pass response drop proportionally, but also the frequency of the peak value increases.

As for the noise of the VCO, the PLL shows high-pass characteristics. The −3 dB bandwidth of the transfer function of equation (31) is given by:

$$\omega_{-3dB} = \omega_n \cdot \sqrt{2\zeta^2 - 1 + \sqrt{2 - 4\zeta^2 + 4\zeta^4}} \quad (37)$$

When the damping factor is 0.707, the −3 dB bandwidth happens to be the natural frequency. When the damping factor is far smaller than 1, the coefficient of the $\omega_n$ in equation (37) is approximately a constant:

$$\omega_{-3dB} \approx \omega_n \cdot \sqrt{\sqrt{2} - 1} \approx 0.644\omega_n \quad (38)$$

When the damping factor is far greater than 1, equation (31) can be simplified to:

$$\omega_{-3dB} \approx 2\zeta\omega_n = \omega_b \quad (39)$$

The above inferential reasoning explains that increasing the natural angular frequency and the damping factor may increase the bandwidth of the high-pass function (except the situation that increasing the damping factor when it is smaller than 1, the effect may not be perceptible), which may consequently reduce the impact of VCO noise.

In situations when input phase noise is very small, for instance, the frequency synthesizer using the crystal oscillator as the input. If it is desired to reduce the phase noise of the PLL itself, a large natural angular frequency and damping factor may be used to suppress noise of inner parts. From equation (7), it may be inferred that a large natural angular frequency can also reduce the size of capacitance. Since the loop capacitance is usually the component that occupies the most area in the PLL, increasing the natural frequency can help reduce the chip area of the PLL. However, in some applications, the reference frequency of input is low, which may restrict the bandwidth to be made higher by taking the continuous-time approximation into account. So, it may be necessary to compromise in line with detailed requirements.

Traditional PLL designs face several challenges. The bandwidth of a charge pump PLL may be very sensitive to process, power supply and temperature. Bandwidth is generally the function of the design parameters $I_{cp}$, $R_{tp}$ and $K_{VCO}$. This may bring desirable design freedom for designers, but may also make the bandwidth more variable. With the change of process, voltage and temperature, each design parameter has a certain variable range, which may bring a corresponding change in bandwidth. A common solution to get the current $I_{cp}$ is to use a bandgap reference source to get a voltage that is independent of voltage and temperature, and divide it by resistance. The resistance is in proportion with the resistance $R_{tp}$ in the loop, so $I_{cp}*R_{tp}$ is in a certain proportion to the reference voltage, and it is also independent of power supply and temperature. However, its oscillation frequency and gain $K_{VCO}$ may greatly depend on process, power supply and temperature, due to the restriction of the structure of CMOS ring oscillator. A ring oscillator that uses a tail current source structure may not be sensitive to supply voltage, but the threshold voltage, mobility, W/L ratio and mismatching may affect the oscillator frequency and gain. These factors may also be dependent on process and temperature.

Requirements for a stable PLL may include: continuous-time approximation, i.e., the unit gain frequency $\omega_b$ is not greater than one-tenth of the angular frequency of the input clock; ensuring a certain phase margin; and a damping factor δ greater than 0.707. Therefore, to achieve continuous-time approximation when taking into account possible changes in process, power supply and temperature, the greatest bandwidth may be constrained to be equal to one tenth of the angular frequency of the input clock, and the smallest bandwidth may be limited to one twentieth to one thirtieth of the input clock frequency. In this way, in order to make the damping factor δ greater than 0.707, the capacitance may restricted by the smallest bandwidth. That is to say, it may not be feasible to meet these basic requirements without excessive capacitance area. Furthermore, other factors may impair performance, such as poor noise frequency (the bandwidth becomes narrower), inadequate filtering effects (the bandwidth becomes wider) and excessive peaking (inadequate phase margin).

The bandwidth of a charge pump PLL is generally in inverse proportion to the frequency multiplication factor N. If the output frequency is programmed by changing the frequency multiplication factor N using a programmable divider, the change of N must be taken into consideration. If N changes by multiple times, a problem of too great change in bandwidth may arise. Placement of a current steering digital to analog converter (IDAC) on the charge pump has been proposed in H. C. Yang, L. K. Lee, and R. S. Co, "A low jitter 0.3-165 MHz CMOS PLL frequency synthesizer for 3 V/5 V operation," *IEEE Journal of Solid-State Circuits*, vol. 32, pp. 582-586, April 1997. This can change the current of the charge pump correspondingly while changing N. While the input clock changes, it may be hard to keep the PLL bandwidth to be one tenth of the input frequency. This may require over-design at the expense of the chip area in order to take the smallest input frequency into account.

Figure 23:
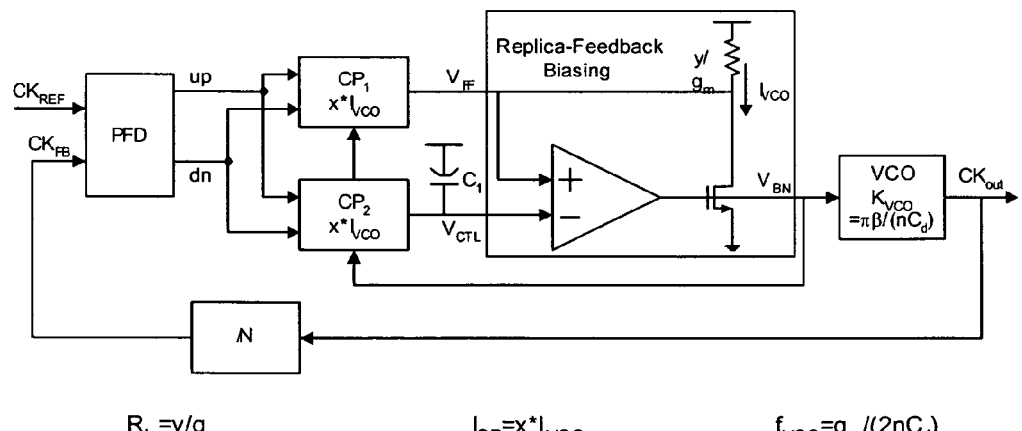
FIG. 23 illustrates a conventional self-biased PLL.

Solutions to such problems have been proposed. The aforementioned John G. Maneatis, "Low-jitter process-independent DLL and PLL based on self-biased techniques." *IEEE Journal of Solid-State Circuits*, vol. 31, pp. 1723-1732, November 1996 proposed a self-biased PLL to make both natural frequency and damping factor independent of process, power supply and temperature, but weak relative to the frequency multiplication factor N. A self-biased PLL, as shown in FIG. 23, includes a replica current source bias, making the current of the charge pump in a certain proportion x to the VCO current, and realizing the loop resistance through transconductance in MOS transistor. The resistance in the figure is an equivalent resistance, and its conductance is 1/y of the transconductance in VCO. Along with the operational amplifier, it is a part of the replica bias.

Generally, the delay time of a delay cell is approximately $C_d/g_m$, wherein $C_d$ is the capacitive load of the delay unit, and $g_m$ is the equivalent transconductance of the delay unit. Multiplying n by delay fall time and delay rise time of each delay cell yields the oscillation cycle of a ring oscillator that is made of n-level cascaded delay units, i.e., the oscillation frequency of the VCO is determined by:

$$f_{OSC} = \frac{g_m}{2n \cdot C_d} = \frac{\beta(V_{CTRL} - V_T)}{2n \cdot C_d} = \frac{\sqrt{2\beta \cdot I_{VCO}}}{2n \cdot C_d} \quad (40)$$

The above equation implies a strongly inverted assumption: $\beta$ is the gain factor of MOS transistor, namely, $\mu C_{ax} W/L$. Using the angular frequency (namely, multiplying the above formula by $2\pi$) and $V_{CTRL}$ for the derivative, the gain of VCO $K_{VCO}$ is:

$$K_{VCO} = \frac{\pi \beta}{n \cdot C_d} \quad (41)$$

The loop resistance is y times as much as the transconductance reciprocal in the VCO:

$$R_{lp} = \frac{y}{\sqrt{2\beta \cdot I_{VCO}}} \quad (42)$$

Substituting the expression for frequency multiplication in combination with equations (40), (41), (42) and (4) yields:

$$\omega_b = \frac{x \cdot y}{2} \cdot f_{REF} \quad (43)$$

According to equation (43), the PLL open loop bandwidth is in direct proportion to input clock frequency, charge pump to oscillator current ratio and MOS transistor in replica bias to transistor in oscillator ratio. The bandwidth may be substantially independent of process, environment temperature and voltage.

In the similar way, expressions for natural frequency and damping factor can be obtained:

$$\omega_n = \sqrt{x \cdot N} \cdot \sqrt{\frac{n \cdot C_d}{C_1}} \cdot f_{REF} \quad (44)$$

$$\zeta = \frac{y}{4} \cdot \sqrt{\frac{x}{N}} \cdot \sqrt{\frac{C_1}{n \cdot C_d}} \quad (45)$$

These equations show that the natural frequency to input clock frequency ratio is in a linear relation to the square root of N, and the damping factor is in a reciprocal relation to the square root of N. Both may also be independent of process, power supply and temperature.

In the above analyses, all parameters are generated inside the circuit, and need no reference source to produce current or voltage. This is referred to as self-biased operation. Because of tangible improvement in the sensitivity of PLL parameters to environment, this technology has been widely used. Similar technologies, such as a regulated supply PLL, are described in S. Sidiropoulos, et al., "Adaptive bandwidth DLLs and PLLs using regulated supply CMOS buffers," *Digest Symp. VLSI Circuits*, pp. 124-127, June 2000, where it is possible to realize the same transfer function without use of replica bias technology.

John G. Maneatis, Jaeha Kim, Iain McClatchie, Jay Maxey and Manjusha Shankaradas, "Self-Biased High-Bandwidth Low-Jitter 1-to-4096 Multiplier Clock Generator PLL," *IEEE Journal of Solid-State Circuits*, vol. 38, pp. 1797-1803, November 2003, combines the self-biased technology with an IDAC to realize a fixed-bandwidth PLL with freely variable N from 1 to 4096 and to integrate a 12-bit IDAC. As N changes the ratio of charge pump to oscillator current, x*N maintains a value m. This approach still uses a sampling-resetting technology. In this technique, the loop resistance, which is realized by the switching capacitance, becomes:

$$R_{lp} = \frac{1}{f_{REF} \cdot C_R} \quad (46)$$

Because $f_{REF} = f_{OSC}/N$, equation (46) can be rewritten as:

$$R_{lp} = \frac{N}{f_{OSC} \cdot C_R} = \frac{N}{\frac{\sqrt{2\beta \cdot I_{VCO}}}{2n \cdot C_d} \cdot C_R} = \frac{N}{\sqrt{2\beta \cdot I_{VCO}}} \cdot 2n \cdot \frac{C_d}{C_R} \quad (47)$$

Replacing equation formula (47) with equation (42) the open-loop bandwidth $\omega_b$, natural frequency $\omega_n$, and damping factor $\delta$ of the PLL are all independent of the feedback frequency-dividing ratio N:

$$\omega_b = m \cdot n \cdot \frac{C_d}{C_R} \cdot f_{REF} \quad (48)$$

$$\omega_n = \sqrt{m \cdot n \cdot \frac{C_d}{C_1}} \cdot f_{REF} \quad (49)$$

$$\zeta = \frac{\sqrt{m \cdot n}}{2} \cdot \sqrt{\frac{C_1 \cdot C_d}{C_R^2}} \quad (50)$$

These equations indicate that the self-biased PLL with IDAC and sampling-resetting technology may resolve the practical problems described above by making the PLL design independent of process and temperature, without substantial change in bandwidth and stability problems when changing the frequency multiplication factor (namely, feedback frequency dividing ratio) of the frequency multiplier loop. These conclusions are all based on the assumption of oscillation frequency described by equation (40). When the oscillation frequency is very low, the transistor in the delay cell will no longer work as a strong inversion type, so the expression of transconductance will no longer follow equation (40).

However, the self-biased PLL with IDAC described above may be complicated to implement. First, it may be difficult or costly to make a 12-bit IDAC. For example, if a multilevel current mirror is used, this may take a lot of energy in design, care in layout arrangement, and close attention to possible impacts of mismatching. From the aspect of design, minimizing mismatching may require the use of long channel transistors, which may occupy a considerable chip area. The sampling-resetting technology may also require delicate circuitry. Moreover, effects such as charge injection and clock feedthrough of the switch may also be substantial. The loop resistance is generally relative to the reference frequency. When the reference frequency is high, the PLL used for filter design (namely, low bandwidth PLL, e.g., a delta-sigma frequency modulation synthesizer) may not have a high resistance without using a small capacitance $C_R$, which greatly saves the size of the large capacitance $C_1$. If the $C_R$ is too small, the sampling-resetting circuit may become vulnerable to the influence of clock feed-through and charge injection.

PLLs with Current-Mode Filters

Figure 24:
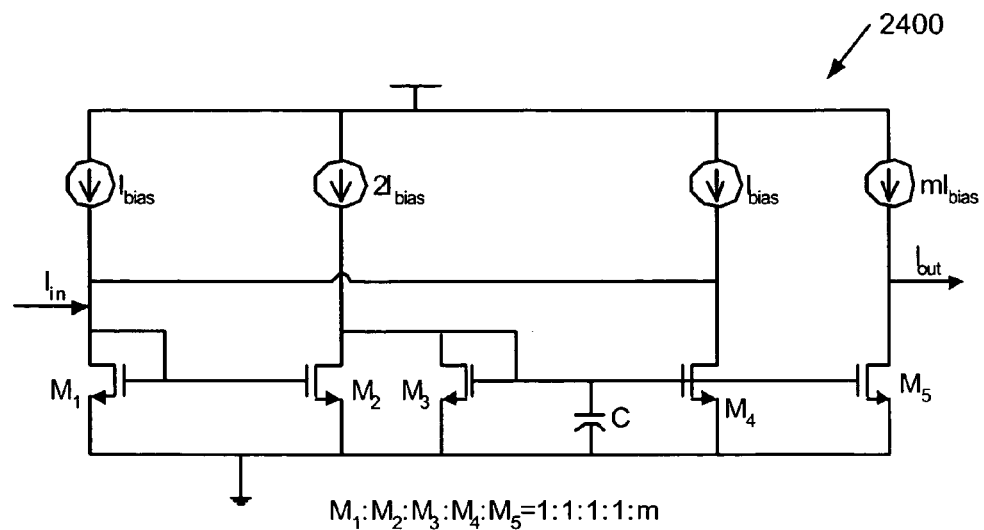
FIGS. 24-28 illustrate current-mode filter configurations that may be used in a PLL according to various embodiments of the present invention.

Current-mode filters have been widely used in signal processing, as they may provide low-voltage operation, low-power consumption, and high frequency response. A current-mode filter typically includes an integrating device. According to various embodiments of the present invention, any of a number of different types of current-mode filters may be used as loop filters in a PLL S.-S. Lee, R. H. Zele, D. J. Allstot and G. Liang, "CMOS continuous-time current-mode filters for high-frequency applications." *IEEE Journal of Solid-State Circuits*, vol. 28, pp. 323-329. March 1993, describes a current-mode integrating circuit 2400 illustrated in FIG. 24. The circuit includes a current mirror including NMOS transistors $M_1$-$M_5$ arranged in a current mirror configuration, and a filter network including a capacitor C coupled between signal ground and gate electrodes of the transistors $M_3$ and $M_4$.

The transfer function of this circuit is:

$$\frac{I_{out}}{I_{in}} = \frac{m \cdot g_m}{s \cdot C}, \quad (51)$$

where m is a constant that is the ratio of output bias current to sub-bias current of integrating device and gm is transconductance of the NMOS channel inside the spur track. As for a loop filter with wide frequency tuning range, a potential problem of such an integrating circuit is that it is desirable that the bias current be greater than the biggest signal current to avoid saturation distortion. However, when the current is lower (that is to say, when the oscillation frequency is not maximized), a relatively large bias current may be needed to achieve higher linearity. R. H. Zele and D. J. Allstot, "Low-power CMOS continuous-time filters." *IEEE Journal of Solid-State Circuits*, vol. 31, pp. 157-168, February 1996, describes a relatively simpler current-mode integrating circuit that may be especially suitable for differential signal processing. The circuit is substantially similar to the circuit of FIG. 24.

Figure 25:
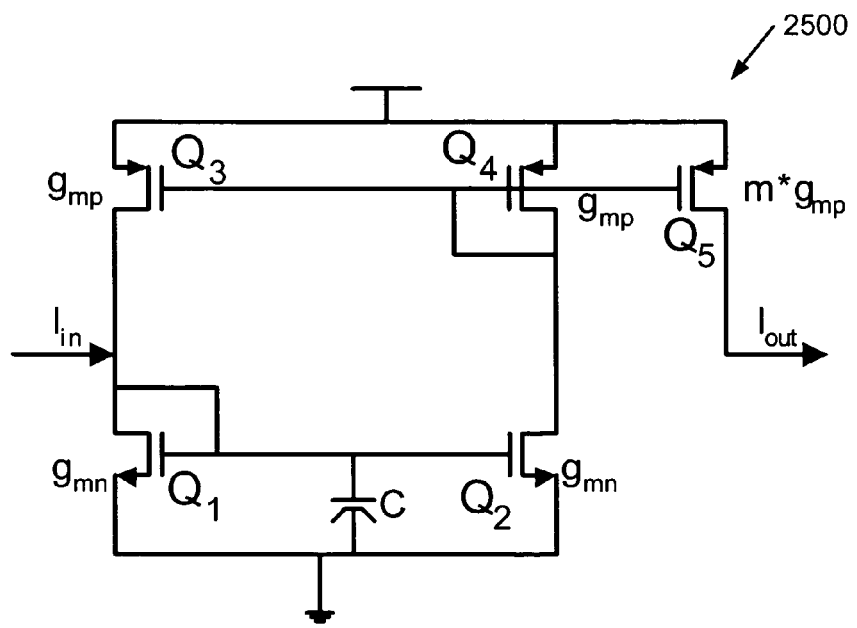

FIG. 25 illustrates another current integrating circuit 2500 that may be used in embodiments of the present invention. The circuit 2500 includes NMOS transistors $Q_1$ and $Q_2$ (with transconductance $g_{mn}$) arranged as a current mirror, along with PMOS bias transistors $Q_3$ and $Q_4$ (with transconductance $g_{mp}$) a PMOS output transistor $Q_5$ (with transconductance $m^*g_{mp}$) and a filter capacitor C coupled between ground and the gate electrodes of the current mirror transistors $Q_1$ and $Q_2$. Assuming that the current mirror is 100 percent matched:

$$\frac{\frac{I_{out}}{m} + I_{in}}{g_{mn} + s \cdot C} \cdot g_{mn} = \frac{I_{out}}{m}. \quad (52)$$

This can be reduced to:

$$\frac{I_{out}}{I_{in}} = \frac{m \cdot g_{mn}}{s \cdot C} \quad (53)$$

Equation (53) shows that the circuit 2500 of FIG. 25 may be viewed as an integrating device, with a unity gain angular frequency of [m·$g_{mn}$/C]. The circuit has no redundant bias, and may save power and space. But the transconductance of the NMOS channels of the circuit generally changes with output current $I_{out}$, because the unity gain angular frequency of the integrating circuit is generally dependent on the bias condition. In other words, linearity of the current-mode integrating circuit 2500 may be poor.

Figure 26:
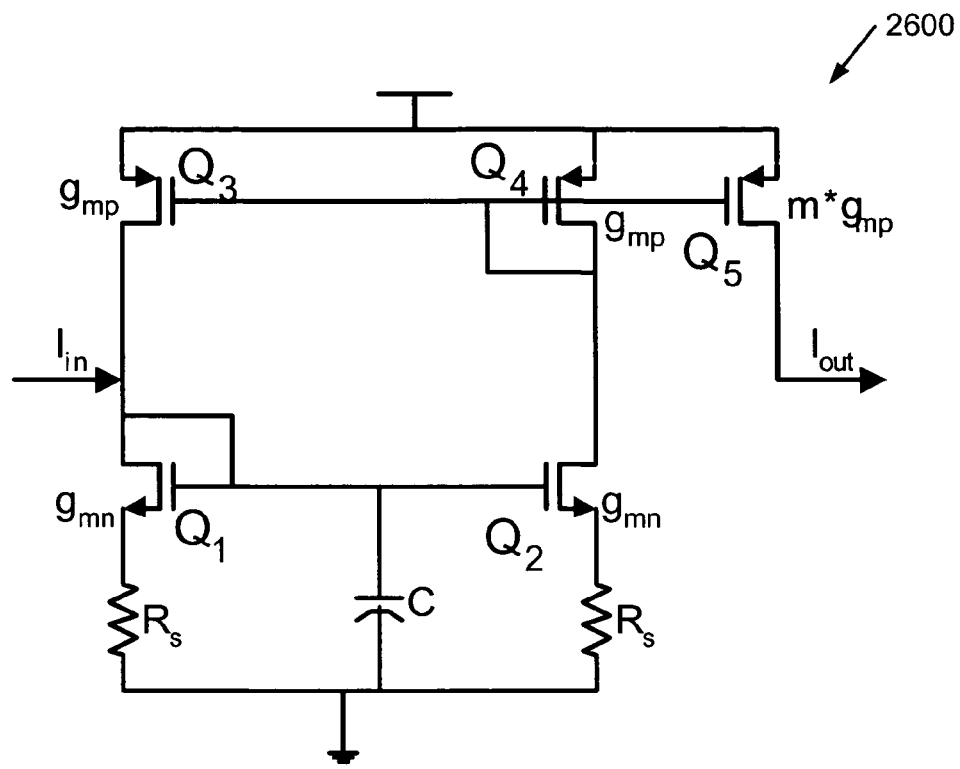

A modification of the circuit 2500 shown in FIG. 25 is shown in FIG. 26. The circuit 2600 adds source resistors Rs. Its transfer function is:

$$\frac{I_{out}}{I_{in}} = \frac{m \cdot g_{mn}}{(1 + g_{mn}R_s) \cdot s \cdot C} = \frac{m \cdot G_m}{s \cdot C}, \quad (54)$$

where $G_m = g_{mn}/(1+g_{mn}R_s)$. If $g_{mn}R_s \gg 1$, then equation (54) is not dependent upon the operation point of the transistors.

Figure 27:
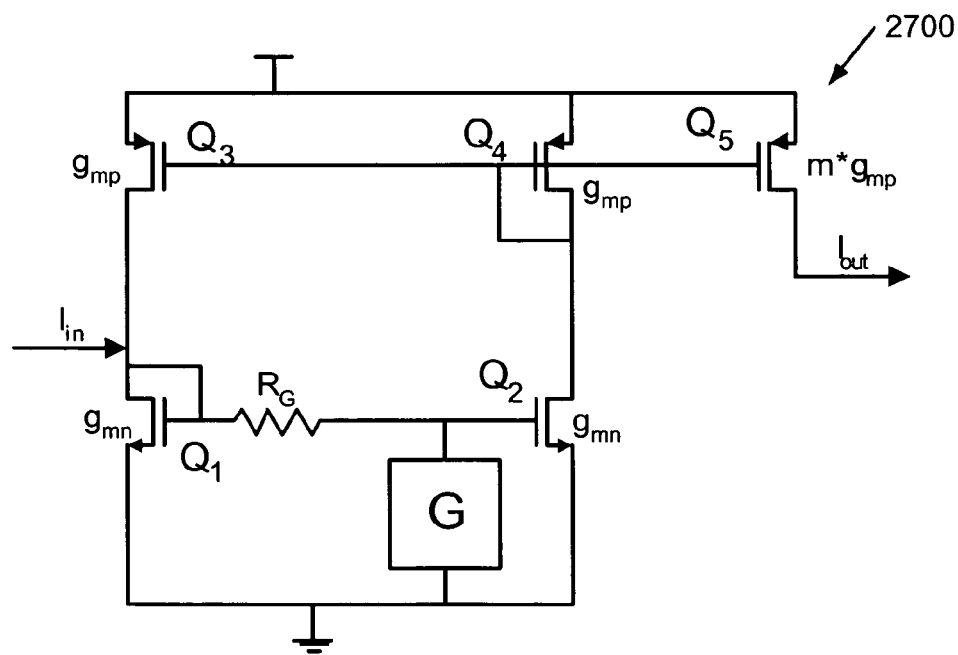

However, the circuit 2600 illustrated in FIG. 26 may have a limited current adjusting range FIG. 27 illustrates a circuit 2700 that is yet another modification of the circuit 2500 of FIG. 25 that may be used in a PLL in accordance with some embodiments of the present invention. The circuit 2700 includes a gate resistor $R_G$ coupled between one of the current mirror transistor Q1 and a conductance G. The transfer function of this circuit is given by:

$$\frac{I_{out}}{I_{in}} = \frac{m \cdot g_{mn}}{(1 + g_{mn}R_G) \cdot G} = \frac{m \cdot G_m}{G}, \tag{55}$$

where $G_m = g_{mn}/(1+g_{mn}R_G)$. The circuits 2500 and 2700 of FIGS. 25 and 27 have similar transfer functions, and the circuit 2700 in FIG. 27 has a current adjustment range similar to that of the circuit 2500 of FIG. 25.

Figure 28:
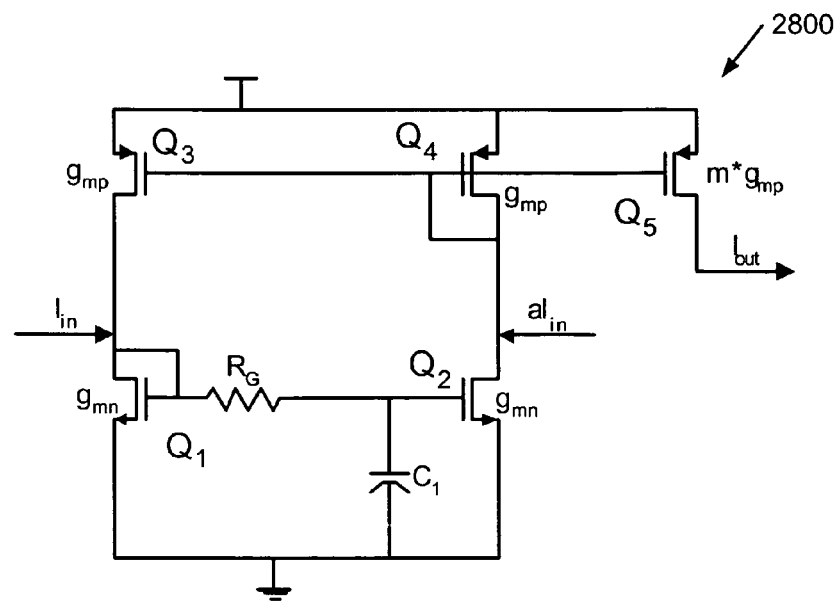

FIG. 28 illustrates circuit 2800 that is a form of the circuit 2700, wherein a resistance $R_{lp}$ and a capacitance $C_1$ is used to provide the conductance G. This adds a zero, producing the transfer function:

$$\frac{I_{out}}{I_{in}} = m \cdot G_m \cdot \frac{1 + s \cdot R_{lp} \cdot C_1}{s \cdot C_1}. \tag{56}$$

The transfer function may be manipulated as follows:

$$\begin{aligned}
\frac{I_{out}}{I_{in}} &= m \cdot \left(G_m \cdot \frac{1-a}{s \cdot C_1} - a\right) \\
&= m \cdot G_m \cdot (1-a) \cdot \frac{1 - \frac{a}{(1-a) \cdot G_m} \cdot s \cdot C_1}{s \cdot C_1}
\end{aligned} \tag{57}$$

Comparing equations 56 and 57, the equivalent resistance is:

$$R_{equ} = \frac{-a}{(1-a) \cdot G_m}. \tag{58}$$

A zero in the left half plane can be reached if a<0 or a>1. When a>1, the transfer function of the current-mode filter is negative.

Figure 29:
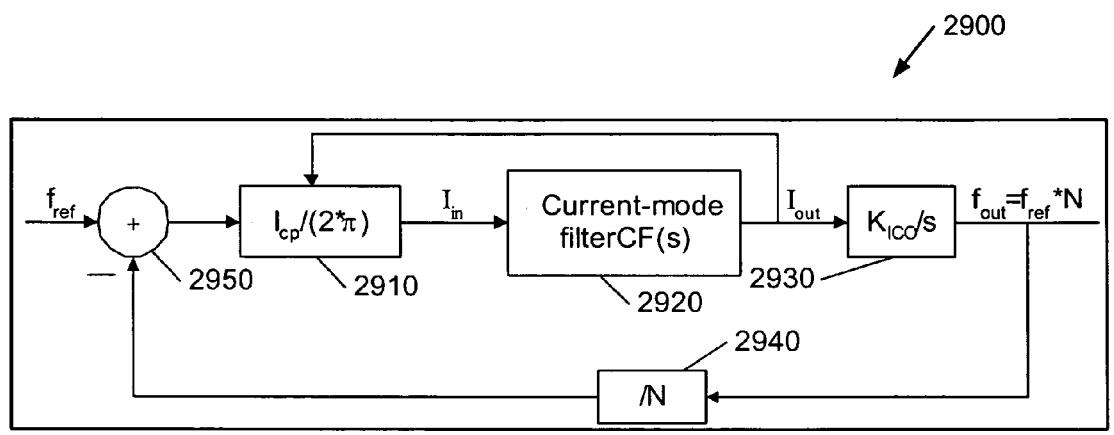
FIG. 29 illustrates a PLL with current-mode loop filter according to some embodiments of the present invention.

FIG. 29 illustrates a self-biased PLL 2900 with current-mode loop filter according to some embodiments of the present invention. The PLL 2900 includes a charge pump 2910, a current-mode loop filter 2920 and a current-controlled oscillator 2930 in its forward path. A feedback gain 2940 is applied to the output frequency $f_{out}$, before subtraction from the reference frequency $f_{ref}$ at a summing junction 2950. The loop filter 2920 has a transfer function CF(s) and may take the form, for example, of one of the current-mode filter circuits described above. The loop gain T(s) is given by:

$$T(s) = \frac{I_{cp}}{2\pi} \cdot CF(s) \cdot \frac{K_{ICO}}{s} \cdot \frac{1}{N} \tag{59}$$

where $K_{ICO}$ relates oscillating angular frequency to control current, in unit rad/s/A.

In some embodiments of the present invention, the current-mode filter 2920 may take the form of the circuit 2800 of FIG. 28. Filter conductance G is provided by resistance $R_{lp}$ and capacitance $C_1$. Substituting equation (56) into equation (59) yields:

$$T(s) = \frac{I_{cp}}{2\pi} \cdot m \cdot G_m \cdot \frac{1 + s \cdot R_{lp} \cdot C_1}{s \cdot C_1} \cdot \frac{K_{ICO}}{s} \cdot \frac{1}{N} \tag{60}$$

The bandwidth is given by:

$$\omega_b = \frac{I_{cp}}{2\pi} \cdot m \cdot G_m \cdot R_{lp} \cdot \frac{K_{ICO}}{N} \tag{61}$$

$K_{ICO}$ may be given by:

$$K_{ICO} = \frac{\pi \cdot \sqrt{2\beta}}{2n \cdot C_d} \cdot \frac{1}{\sqrt{I_{ICO}}} \tag{62}$$

If [$N=f_{OSC}/f_{REF}$] and [$g_m*R_G \gg 1$], then Gm is approximately [$1/R_G$], and the bandwidth may be given by:

$$\omega_b = \frac{1}{2} \cdot m \cdot \frac{R_{lp}}{R_G} \cdot \frac{I_{cp}}{I_{ICO}} \cdot f_{REF} \tag{63}$$

Thus, the bandwidth is proportional to input reference clock. The natural angular frequency and damping factor are:

$$\omega_n = \sqrt{\frac{\omega_b}{R_{lp} \cdot C_1}} \tag{64}$$

$$\zeta = \frac{1}{2} \cdot \sqrt{\omega_b} \sqrt{R_{lp} \cdot C_1} \tag{65}$$

It is reasonable to assume that the input reference clock is fixed, so natural angular frequency and damping factor may be considered dependent on process and temperature, which affect resistance and capacitance. If changes in resistance do not surpass ±30%, grid capacitance of the MOS channel may be controlled very well, e.g., so that is does not exceed ±10%, so changes in natural angular frequency and damping factor may be constrained to within ±20%, which may be acceptable. Thus, performance that is similar to that of a self-biased PLL may be achieved using a relatively simple circuit. In some embodiments of the present invention, such as those described below, a multi-order ($2^{nd}$ or greater order) filter may be used to filter out the high frequency spurious.

A problem often associated with current mirrors is mismatching. Mismatching, together with noise, may degrade the performance of a current-mode circuit. In fact, a potentially significant problem with the circuit 2700 shown in FIG. 27 may occur when there is no signal input, which can be very common in PLL applications. This means that the charge pump does not produce an output signal when there is no static phase error if the PLL is locked, and the circuit 2700 of FIG. 27 will carry out the integral calculation on the current mismatch. This mismatch may include random mismatch caused by process and systematic mismatch caused by the circuit operation point. This integrating effect may act on 1/f noise as well.

Figure 30:
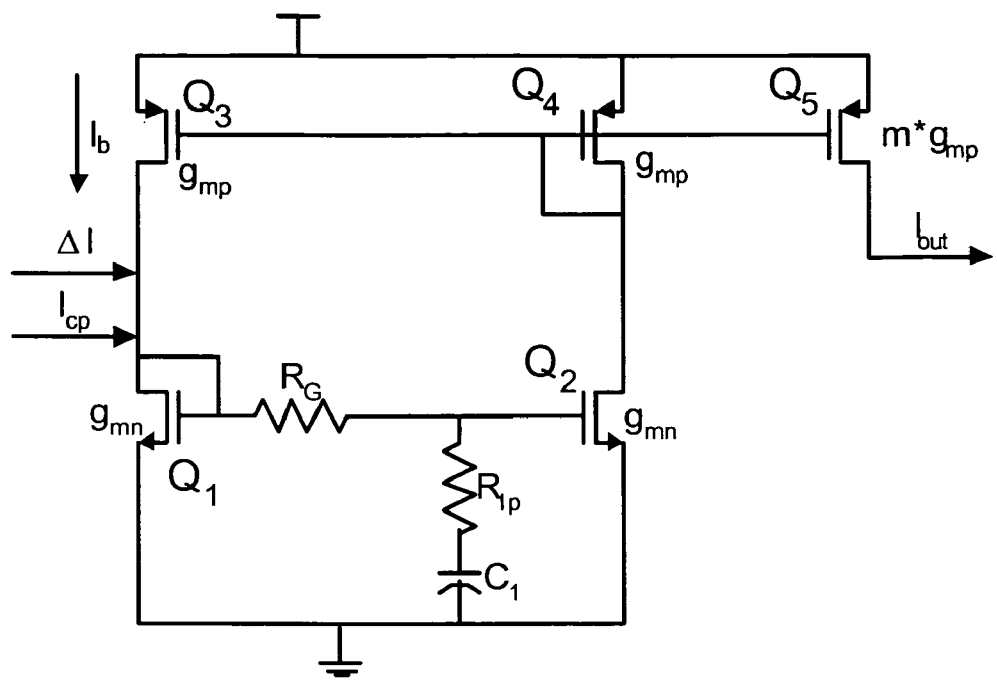
FIG. 30 illustrates behavior of a current-mode filter that may be used in a PLL according to some embodiments of the present invention.

To explain this problem, it may be assumed that the static phase error is t when the PLL is locked and the period of the discriminator clock is $T_{REF}$. All the current mismatching may then be equal to the input end as shown in [$\Delta I$], as illustrated in FIG. 30. When the PLL is locked, the net charge provided to the loop filter in every period should be zero, such that:

$$\Delta I \cdot T_{ref} = I_{CP} \cdot t \tag{66}$$

Dividing by [$I_b(I_b=I_{out}/m)$] produces the following expression for the static phase error:

$$t = \frac{1}{m} \cdot \frac{\Delta I}{I_b} \cdot \frac{I_{out}}{I_{cp}} \cdot T_{ref} \tag{67}$$

Figure 31:
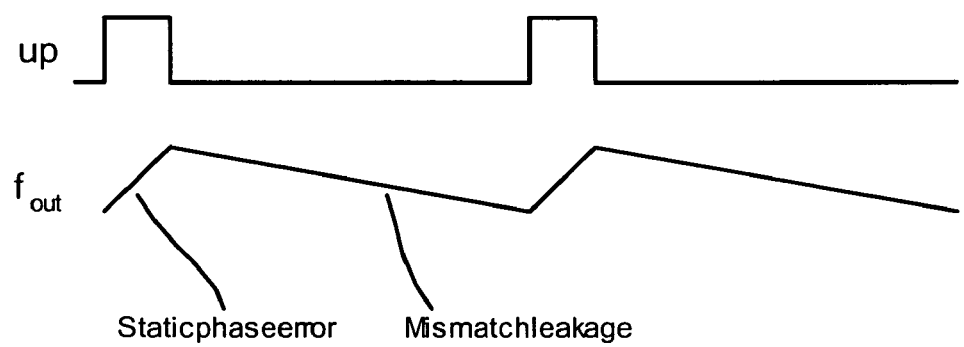
FIG. 31 illustrates behavior of a PLL having a current-mode filter according to some embodiments of the present invention.

The static phase error and the period have a substantially linear relationship, with the lower the reference frequency, the greater the static phase error. The [$\Delta I/I_b$] mismatch magnitude is about 0.1-1%. Optimistically, estimating 0.1% and make m=1 and [$I_{out}/I_{cp}$]=10, the static phase error is [1% $T_{REF}$]. In the frequency multiplication loop, if the frequency multiplication ratio is larger than 100, the static phase error of [1% $T_{REF}$] will cause jitter as shown in FIG. 31. The integrating effect on 1/f may magnify the low frequency noise, which may also affect the output clock jitter.

Figure 32:
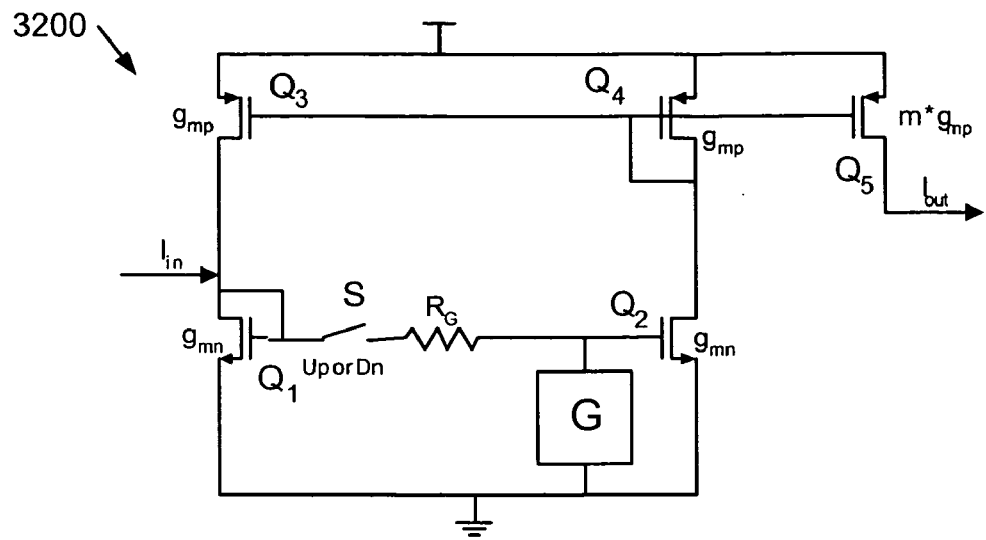
FIGS. 32-35 illustrate a current-mode filter according to some embodiments of the present invention.

In a conventional voltage-mode PLL, only when there is an up or dn signal does the charge pump integrate. If there is no signal, the loop filter remains at its current voltage. A current-mode circuit according to further embodiments of the present invention may be configured to achieve a similar effect. As shown in FIG. 32, a circuit 3200 having the filter configuration of FIG. 27 may include a switch S controlled by an up or dn signal, such that integration is disabled when no charge pump signal is asserted. When the switch is opened, the output current $I_{out}$ remains at its current level. With the switch S present, the static phase error is substantially independent of the period, which can alleviate the problems noted above.

Figure 33:
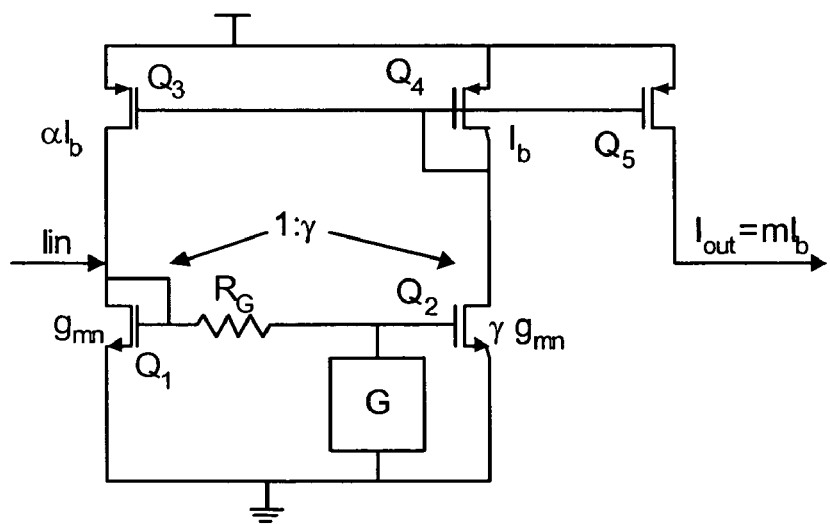

Although using a switch or other technique to disable integration may solve some important problems, current source mismatching may still be an issue. FIG. 33 illustrates mismatching, where $\alpha$, $\gamma$ are current mirror matching factors with that vary about nominal values of 1:

$$\frac{I_{out}}{I_{in}} = \frac{m \cdot \gamma \cdot g_{mn}}{(1 - \alpha \cdot \gamma)g_{mn} + (1 + g_{mn} \cdot R_G) \cdot G} \tag{68}$$

$$= \frac{\frac{m \cdot \gamma \cdot g_{mn}}{1 + g_{mn} \cdot R_G}}{\frac{(1 - \alpha \cdot \gamma)g_{mn}}{1 + g_{mn} \cdot R_G} + G}$$

The mismatching term $\gamma$ in the numerator affects the gain and slightly changes the bandwidth. Taking mismatching into consideration, the pure resistance $R_{lp}$ is combined with $$\left[\frac{(1 - \alpha \cdot \gamma)g_{mn}}{1 + g_{mn} \cdot R_G}\right].$$

To reduce the mismatching effect:

$$\frac{(1 - \alpha \cdot \gamma)g_{mn}}{1 + g_{mn} \cdot R_G} \ll \frac{1}{R_{lp}} \tag{69}$$

If [$g_m^* R_G \gg 1$], then the above formula can be reduced to:

$$1 - \alpha \cdot \gamma \ll \frac{R_G}{R_{lp}} \tag{70}$$

If $R_G$ and $R_{lp}$ have the same magnitude, the current mirror mismatching generally can be easily made to be less than 5%.

Figure 34:
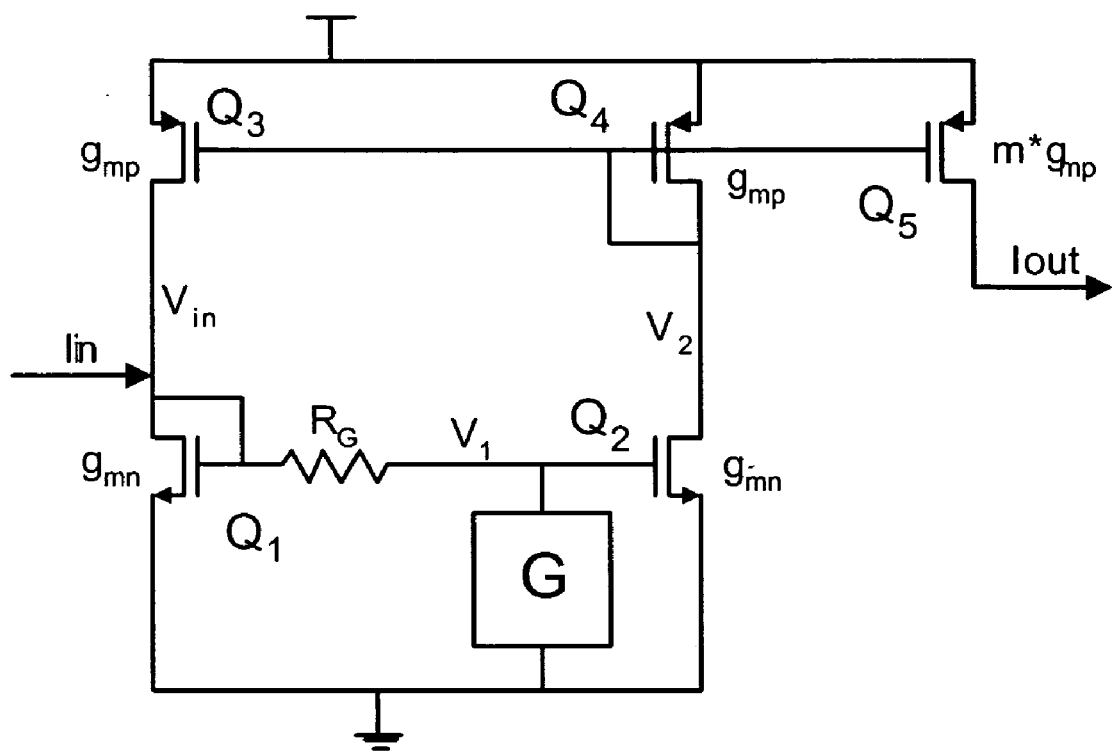
Figure 35:
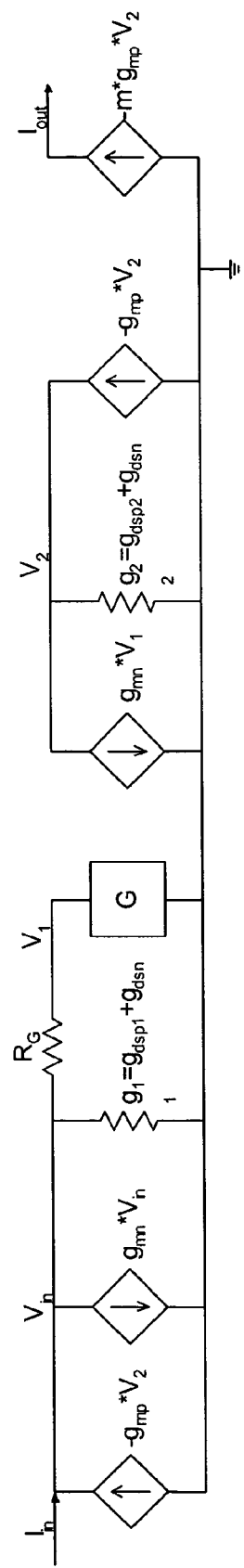

The above analysis does not take the output impedance of the current source into consideration, namely, it assumes the current source has infinite impedance. However, in practice, the current source impedance is finite. FIG. 34 illustrates voltages and currents for the current-mode filter 2700 of FIG. 27, and FIG. 35 illustrates its small signal model.

The following four equations apply:

$$I_{in} - g_{mp} \cdot V_2 - g_{mn} \cdot V_{in} - g_1 \cdot V_{in} - \frac{1}{R_G} \cdot (V_{in} - V_1) = 0 \tag{71}$$

$$V_1 = \frac{1/G}{R_G + 1/G} \cdot V_{in} \tag{72}$$

$$-g_{mp} \cdot V_2 - g_2 \cdot V_2 - g_{mn} \cdot V_1 = 0 \tag{73}$$

$$I_{out} = -m \cdot g_{mp} \cdot V_2 \tag{74}$$

Solving this group, the transfer function is:

$$\frac{I_{out}}{I_{in}} = \frac{m \cdot g_{mn}}{\frac{g_1 \cdot g_2}{g_{mp}} + \frac{g_2 \cdot g_{mn}}{g_{mp}} + g_1 + \left(\frac{g_2 \cdot g_{mn}}{g_{mp}} \cdot R_G + \frac{g_2 \cdot g_1}{g_{mp}} \cdot \frac{g_2}{g_{mp}} + g_{mn} \cdot R_G + g_1 \cdot R_G + 1\right) \cdot G}$$

$$\approx \frac{m \cdot g_{mn}}{\frac{g_2 \cdot g_{mn}}{g_{mp}} + g_1 + (1 + g_{mn} \cdot R_G) \cdot G}$$

$$= \frac{\frac{m \cdot g_{mn}}{1 + g_{mn} \cdot R_G}}{\frac{g_2 \cdot g_{mn}}{g_{mp}} + g_1}{1 + g_{mn} \cdot R_G} + G$$

This is similar to the current source mismatching, with a term $$\left[\frac{\frac{g_2 \cdot g_{mn}}{g_{mp}} + g_1}{1 + g_{mn} \cdot R_G}\right]$$

added to the denominator. This term corresponds to the nonzero conductance of the left branch circuit combining the right branch circuit equivalent to the left conductance, attenuated by $[(1+g_{mn}\cdot R_G)]$. After taking the current source finite impedance into consideration, the $R_{tp}$ in the calculation of the PLL bandwidth is in parallel with the current source equivalent impedance. To reduce influence on the bandwidth:

$$\frac{\frac{g_2 \cdot g_{mn}}{g_{mp}} + g_1}{1 + g_{mn} \cdot R_G} \ll \frac{1}{R_{lp}} \tag{76}$$

Applying this to $[g_m{}^*R_G \gg 1]$ yields:

$$\frac{\frac{g_2 \cdot g_{mn}}{g_{mp}} + g_1}{g_{mn}} \ll \frac{R_G}{R_{lp}} \tag{77}$$

Assume that the left side of relation (77) has a magnitude of about 1%, while $R_G$ and $R_{lp}$ have about the magnitude of the same order. From this, it can be seen that the cascade current source may not be necessary. Cascode can increase the current source output impedance, but it may reduce the voltage swing and the current tuning range. From equations (70) and (77), it can be seen that a greater ratio $R_G/R_{lp}$ may be desirable. In particular, the greater the $R_G$, the more the effect of mismatching or finite impedance attenuates, while the smaller the $R_{lp}$, the less influence from the resistance paralleled with it.

To estimate the oscillating frequency of the ring oscillator, a lot of nonlinear factors may be taken into consideration, which may be very complicated.

Referring to the discussion of FIG. 23 and equation (40) above, the transconductance $g_m$ of a delay cell generally depends on the operating point of the transistor. In strong inversion for a, the transconductance is the square root of the current $I_{ICO}$, while in weak inversion, the transconductance and the current $I_{ICO}$ may have a linear relationship:

$$gm_{ICO(SI)} = \sqrt{2 \cdot \beta \cdot I_{ICO}} \tag{78}$$

$$gm_{ICO(WI)} = \frac{I_{ICO}}{n' \cdot \frac{kT}{q}} \tag{79}$$

The subscripts SI, WI in the above equations represent, respectively, strong inversion and weak inversion, and [n'] is the sub-threshold factor, K is the Boltzmann constant, T is the absolute temperature and q is the charge of an electron. The differences between the strong-inversion and the weak-inversion explain that, when the control current is different, i.e., when the oscillating frequency is very large or very small, the function of the oscillation frequency to the control current changes.

To determine the influence of this change, $K_{ICO}$ may be determined for the two situations respectively, by taking the derivative of $\omega_{osc}$ with respect to $I_{ICO}$:

$$K_{ICO(SI)} = \sqrt{\frac{\beta}{2 I_{ICO}}} \cdot \frac{\pi}{n \cdot C_d} \tag{80}$$

$$K_{ICO(WI)} = \frac{1}{n' \cdot \frac{kT}{q}} \cdot \frac{\pi}{n \cdot C_d} \tag{81}$$

Applying to the bandwidth expression of equation (61) produces:

$$\omega_{b(SI)} = \frac{1}{2} \cdot m \cdot \frac{I_{CP}}{I_{ICO}} \cdot \frac{R_{lp}}{R_G} \cdot f_{REF} \tag{82}$$

$$\omega_{b(WI)} = m \cdot \frac{I_{CP}}{I_{ICO}} \cdot \frac{R_{lp}}{R_G} \cdot f_{REF} \tag{83}$$

Equations (82) and (83) show two extremes for the PLL bandwidth. The PLL bandwidth at low oscillating frequency may be greater than the PLL bandwidth at high oscillating frequency. If the reference frequency remains the same, while changing the frequency multiplication factor N, the bandwidth may be great when N is small and vice versa. Generally speaking, the current index in the expression of the frequency to the controlling current will be the coefficient of the bandwidth formula. In fact, the curve of the oscillating frequency, which may be obtained by simulation, is about a 0.87 power of the control current. The oscillation frequency varies from 200 MHz to 1.6 GHz. Its index changes do not exceed [±20%], and are between equations (82) and (83). A similar phenomenon may also be present in a conventional self-biased PLL. Compared to the changes of the frequency multiplication factor, the change of the PLL bandwidth may be very small.

A test circuit according to some embodiments of the present invention has been implemented using 0.35 μm single level polysilicon technology, based on a triple metal standard CMOS technology. The test circuit includes a PFD, charge pump, current-mode loop filter, current-controlled oscillator and feedback divider.

Figure 36:
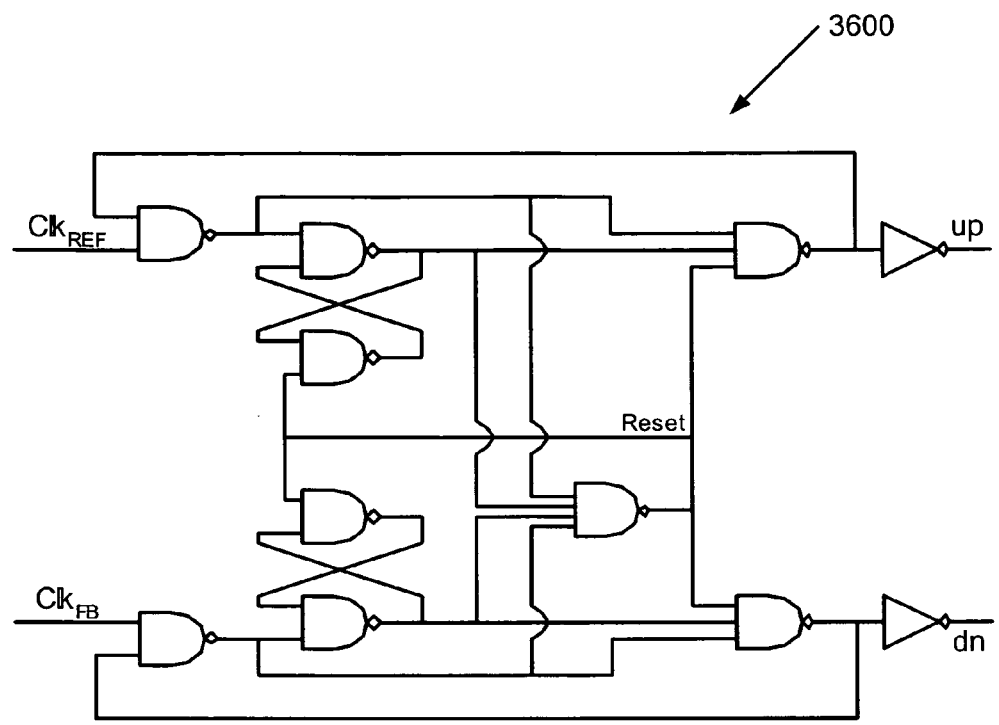
FIG. 36 illustrates phase-frequency detector (PFD) that may be used in a PLL according to some embodiments of the present invention.

If the input clock and the feedback clock are digital signals, a sensitive exclusive-OR-gate discriminator or edge-sensitive PFD may be used. The linear range of a typical exclusive-OR-gate discriminator is π, which is also related with the duty cycle of the signal. A PFD 3600 described in I. A. Young, J. K. Greason, and K. L. Wong, "A PLL clock generator with 5 to 110 MHz of lock range for microprocessors," *IEEE Journal of Solid-State Circuits*, vol. 27, pp. 1599-1606, November 1992, that may be used in embodiments of the present invention is shown in FIG. 36. In the PFD circuit 3600, when the reference clock signal $Clk_{REF}$ leads the feedback clock signal $Clk_{FB}$, "up" is 1, and the pulse width is equal to the lead interval; when the reference clock signal $Clk_{REF}$ lags behind the feedback clock signal $Clk_{FB}$, "dn" is 1, and the pulse width is equal to the lag time. It will be appreciated that a variety of other types of PFD circuits may be used in various embodiments of the present invention.

Figure 37:
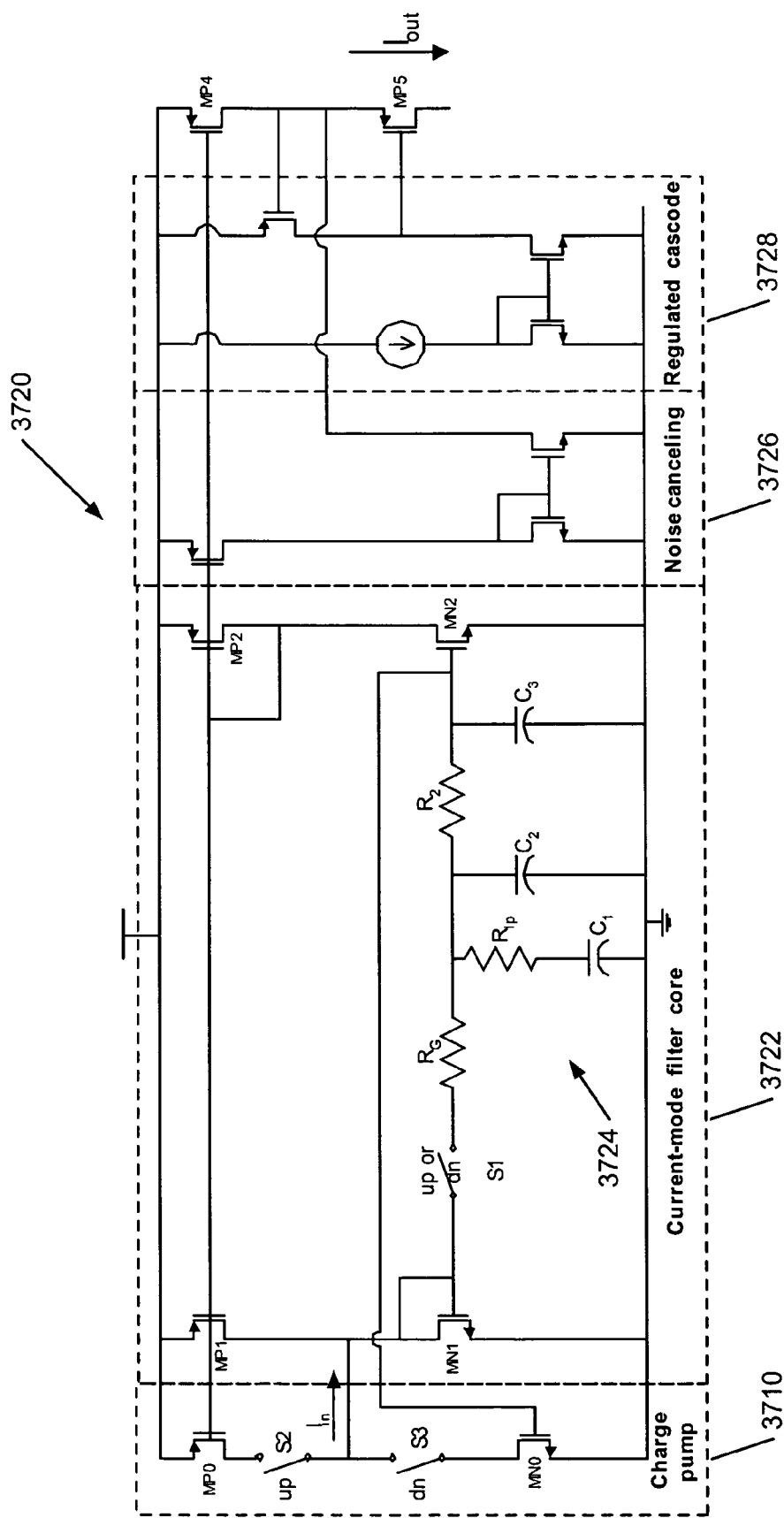
FIG. 37 illustrates a charge pump and current-mode filter circuit for a PLL according to some embodiments of the present invention.

FIG. 37 illustrates a charge pump 3710 and current-mode filter 3720 that may be used in a self-biased current-mode PLL according to some embodiments of the present invention. The charge pump 3710 includes transistors MN0 and MP0, along with switches S2 and S3 that are responsive to "up" and "dn" signals received from a PFD, e.g., the PFD 3600 of FIG. 36.

The current mode filter circuit 3720 includes a core 3722 that includes current mirror transistors MN1 and MN2 and bias transistors MP1 and MP2. A switch S1 is configured to connect and disconnect a third-order filter network 3724 to and from a gate of the transistor MN1. The filter network 3724 includes resistors $R_G$, $R_{lp}$ and $R_2$, and capacitors $C_1$, $C_2$ and $C_3$. The filter circuit 3720 further includes a noise canceling circuit 3726 and a regulated cascade current source 3728 and output transistors MP4 and MP5.

The current produced by the charge pump circuit 3710 is ⅛ of the mirror image of the output current Iout. The initial state the output current Iout is approximately zero and there is no current in the charge pump 3710, which could make the PLL hard to capture. Therefore, a very small current source (not shown) may be added to start oscillation. In the test circuit, a 3 µA current was provided, which can be neglected at a medium frequency (e.g., around 100 MHz). Such a current source may, for example, be turned off via register settings. It will be understood that other startup circuits may be used.

The switch S1 is controlled by the "up" and "dn" signals. When either of these signals is asserted, the current-mode filter 3720 is enabled to filter the input current; when neither is asserted, the loop is opened. The third-order filter 3724 may filter canaries effectively. To save power, each branch current of the current-mode filter 3720 is half of the output current, i.e. m=2. The regulated cascade circuit 3740 may change the power supply rejection ratio by increasing the output impedance.

Mismatching of the current source may not significantly affect performance. However, it may be desirable to use a short channel transistor as a current source to avoid large flicker noise. Also, because the current-mode filter 3724 may occupy a relatively small area, use of longer channel transistor may not unduly increase the total area. The test circuit uses N and P transistors with 1.5 µm channel lengths. For the typical 0.35 µm process, $A_{VTn}$ is 10 mV µm; $A_{VTp}$ is 17 mV µm. It has been determined from simulation that when the oscillation is 800 MHz, NMOS transconductance is 2.243 mS, and PMOS transconductance is 2.114 mS. It can be estimated that the mismatching factor α is probably 98.7% (3σ) and γ is probably 98.8% (3σ). Thus, the left side of equation (70) may be less than 0.025. It may be assumed that $[R_{lp}/R_G]$ is 1 to satisfy equation (70).

It is assumed that the transistors are working in saturation. If the oscillating frequency is very high, requiring a large current output from the current-mode filter, then the NN2 grid is very high and the drain is very low; in other words, the MP1 (MP3) grid is very low and the drain is very high. All these transistors, therefore, may enter the linear region, which can change behavior of the circuit. To achieve wider frequency range, this may be avoided.

Figure 38:
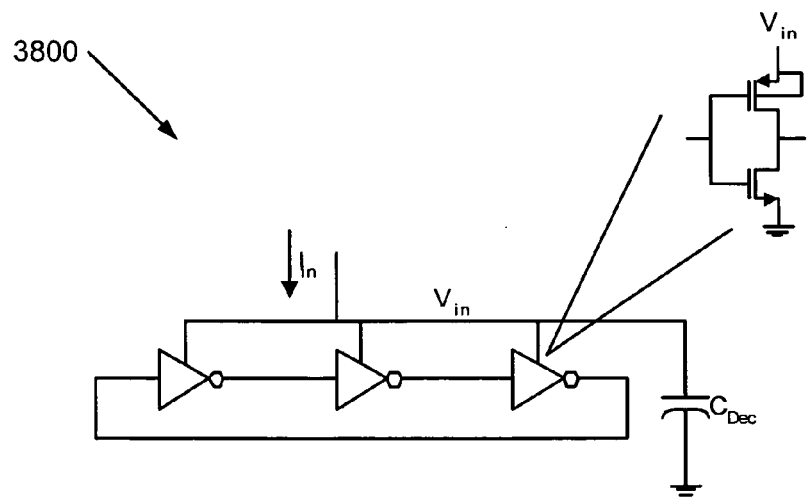
FIGS. 38-39 illustrate a current-controlled oscillator that may be used in a PLL according to some embodiments of the present invention.

A current controlled oscillator circuit 3800 used in the self-biased PLL test circuit according to some embodiments of the present invention is shown in FIG. 38. The oscillator circuit 3800 includes a plurality of CMOS inverter delay cells 3810 connected in a ring configuration to form a ring oscillator, which can run at over 1 GHz in the 0.35 µm process used for the test circuit. The delay cells 3810 are controlled by the current $I_{in}$, which may be the output current Iout of the current-mode filter 3720 of FIG. 37. The control current and the impedance of the delay cells 3810 determine the voltage $V_{in}$ applied to the delays 3810:

$$V_{in} \propto \frac{I_{in}}{3\overline{g_m}} \propto \sqrt{I_{in}} \propto f_{osc}, \qquad (84)$$

where $\overline{g_m}$ indicates the average transconductance between NMOS and PMOS in an oscillation period in the inverter. The oscillation amplitude and the oscillating frequency are in proportion. The higher the oscillating frequency, the greater the oscillation amplitude, and the quicker the change rates of rising and trailing edges. If the edge rate are quick, the circuit will not be particularly sensitive to device noise or power fluctuation. This characteristic may keep the circuit shown in a low-jitter state when high frequency oscillation occurs. To ensure the duty cycle of the output clock, a dimidiate frequency divider may be placed between the ring oscillator and the output. A capacitance $C_{DEC}$ of several dozens of picofarads (pF) is shown between node $V_{in}$ and ground. This capacitance may make ground noise substantially transparent to the delay cell. Power supply noise, isolated by the high impedance current source, may have little effect on the oscillator. It will be understood that some embodiments of the present invention may use other ring oscillator structures and/or other types of oscillators (e.g., crystal, RC, LC resonance, DDFS).

Figure 39:
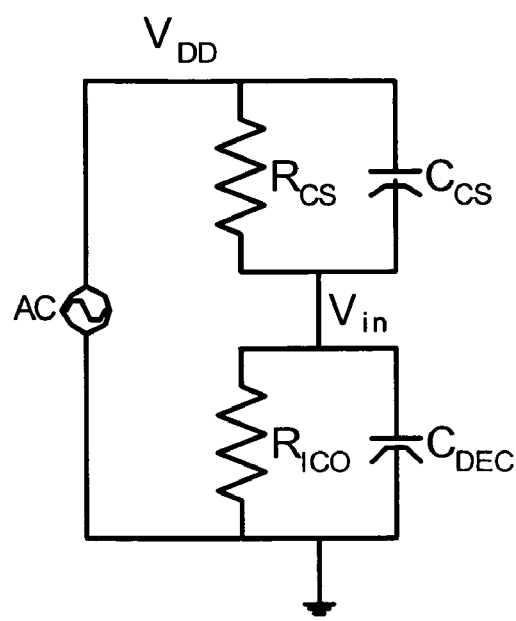

FIG. 39 illustrates an equivalent circuit for analyzing power supply noise. In the figure, $R_{CS}$ is the output impedance of the current source, $R_{CS}$ is the parasitic capacitance from power $V_{DD}$ to the node $V_{in}$, $R_{ICO}$ is the average impedance of the oscillator, namely the reciprocal of $[3\overline{g_m}]$. This is a single-pole, single-zero system:

$$\frac{V_{in}}{V_{DD}} = \frac{R_{ICO} \cdot (1 + s \cdot C_{CS} \cdot R_{CS})}{(R_{CS} + R_{ICO}) \cdot [1 + s \cdot (C_{CS} + C_{DEC}) \cdot \frac{R_{ICO} \cdot R_{CS}}{R_{ICO} + R_{CS}}]} \qquad (85)$$

At low frequency, it is the partial pressure of two resistances; when in high frequency, it is the partial pressure of two capacitances. Therefore, it may be helpful for the input current to reduce the impact of low-frequency power noise by using a regulated cascade current source to increase the output impedance. Moreover, $C_{DEC}$ augmentation may be beneficial to the increase of power supply rejection ratio.

Figure 40:
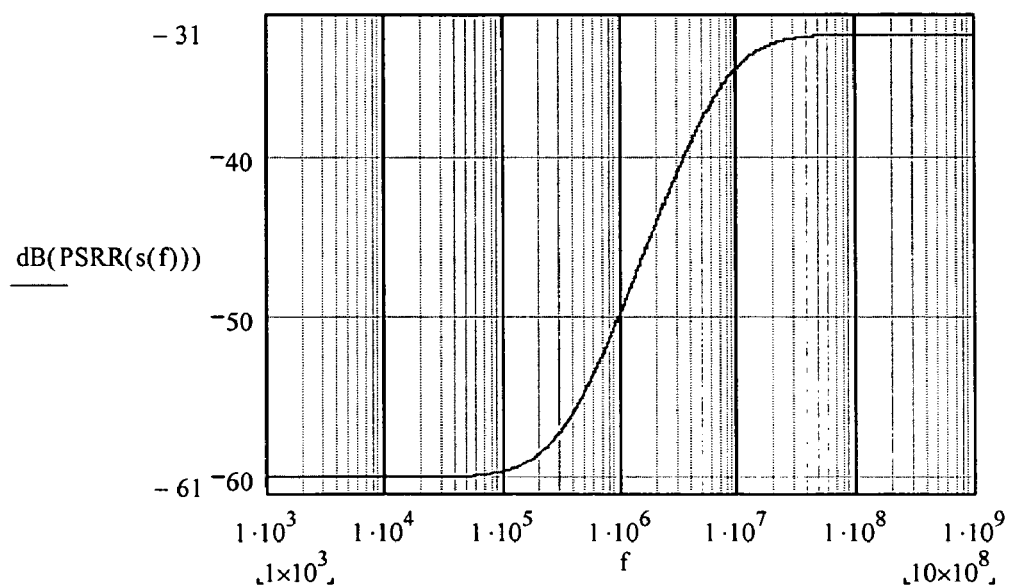
FIG. 40 illustrates a power supply rejection behavior of a current-mode filter circuit according to some embodiments of the present invention.
Figure 41:
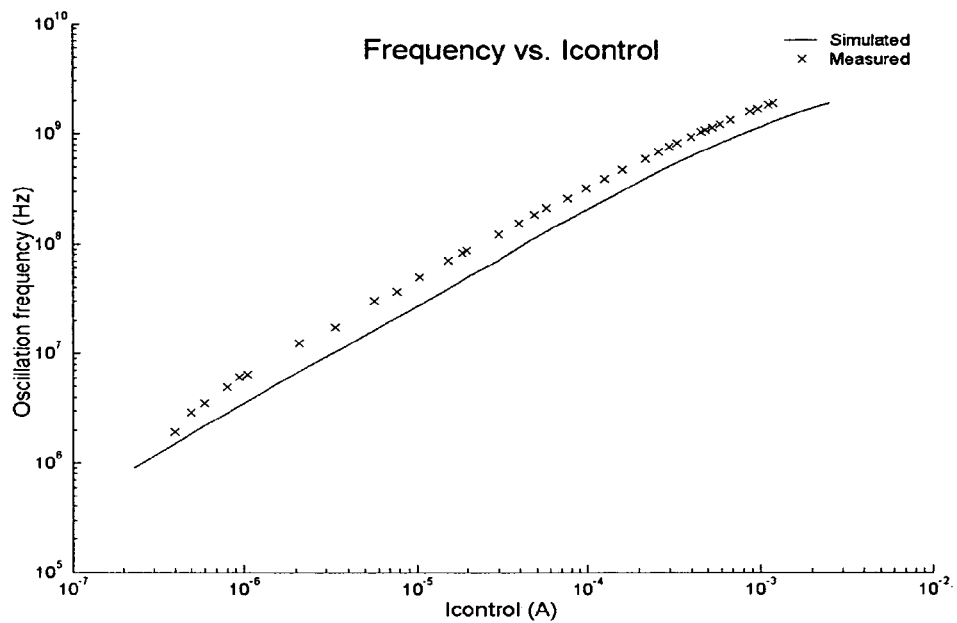
FIG. 41 illustrates simulated and measured performance of a PLL according to some embodiments of the present invention.

FIG. 40 indicates a typical oscillogram for power supply rejection ratio (PSRR) of a current-controlled oscillator. When the PLL is closed, the power supply rejection ratio is multiplied by $K_{VCO}/S$ and divided by (1+loop gain) to obtain the power supply rejection ratio of the output phase. A simulation shows that the gain of the oscillating frequency to the control current (e.g., the current $I_{in}$ of FIG. 38) is close to the indicial response, with the index being about 0.87, as shown in FIG. 41. The measured characteristic curve of the current-controlled oscillator of the test circuit is also shown in FIG. 41. From curves at several dozens of megahertz (MHz), the test result is a fixed ratio greater than the simulation result. The measured gain curve shows that oscillators having such a structure may have a large frequency range, from several megahertz (MHz) to over 1 gigahertz (GHz).

Figure 42:
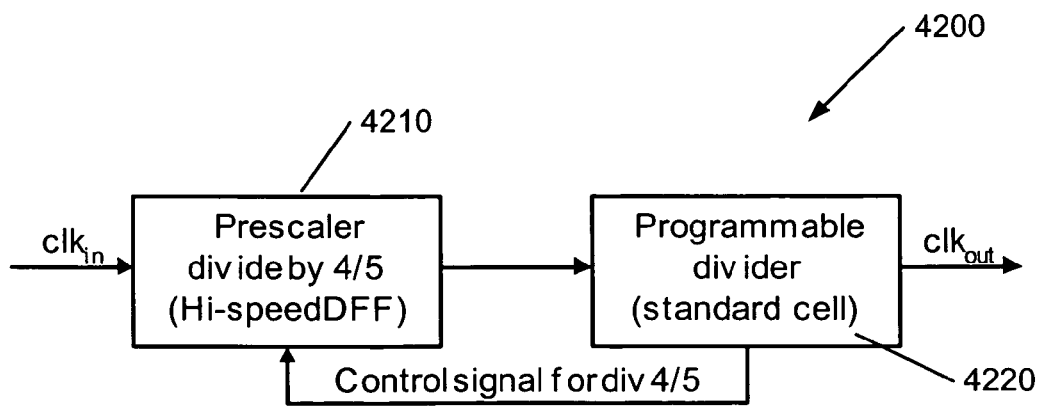
FIG. 42 illustrates a feedback divider circuit that may be used in a PLL according to some embodiments of the present invention.

For high-frequency applications, a frequency divider 4200 with a two-stage structure including a high-speed prescaler 4210 and a programmable divider 4220, as shown in FIG. 42, may be used for feedback to the PFD. Compared with a conventional synchronous divider, this circuit may provide many advantages. It may avoid problems of too much load, caused by the fact that, when the division ratio is big, the top-speed clock has to drive so many D flip-flop triggers. It may not have unduly strict requirements for time sequencing of the programmable divider 4220, if high-speed frequency-division pressure is put only on the prescaler 4210. Power consumption may also be reduced. In fact, since the programmable divider 4220 may be implemented using a standard cell, there may be no need to have a special design that trade the area off the speed.

Figure 43:
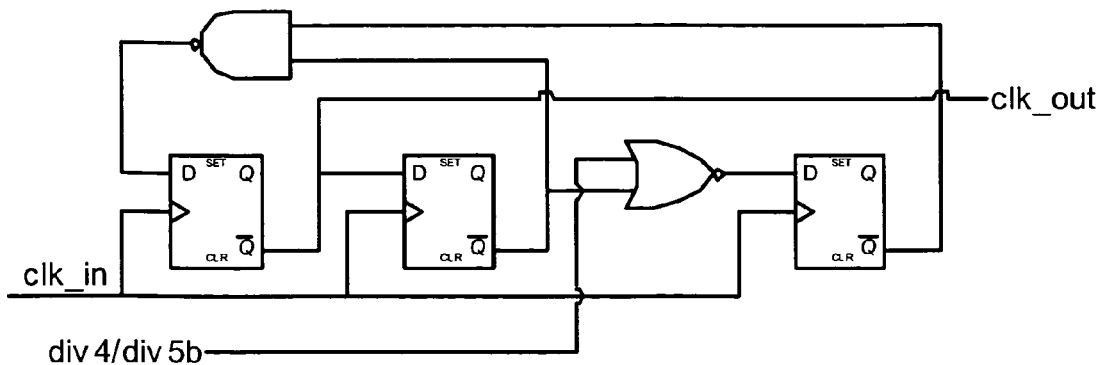
FIG. 43 illustrates a dual modulus divider circuit that may be used in a feedback circuit of a PLL according to some embodiments of the present invention.

The high-speed prescaler 4210 has two divisors, and may also be referred to as a dual modulus divider. A division ratio that is more than 16 can be broken down into the sum of several 4s and several 5s, namely:

$$N=4p+5q \quad (86)$$

where N is the division ratio, and p and q are positive integers. To facilitate design, it may be assumed that q is a natural number from 0 to 3, which can simplify design of the programmable divider. An exemplary dual modulus divider 4300 that divides by 4 or 5 and that may be used as a prescaler is shown in FIG. 43. A maximum one logic-gate delay is present from each stage to the next stage, therefore, the speed can be very high. The DFF in the prescaler may be designed to meet the requirements for high-speed frequency division.

Assuming a design with a reference frequency of 6.667 MHz and an open-loop bandwidth of 200 KHz, because the oscillation frequency of the current-controlled oscillator is generally in proportion to the 0.87 equation of power of the control current, bandwidth may be expressed as:

$$\omega_b = 0.87 \cdot m \cdot \frac{I_{CP}}{I_{ICO}} \cdot \frac{R_{lp}}{R_G} \cdot f_{REF} \quad (87)$$

Figure 44:
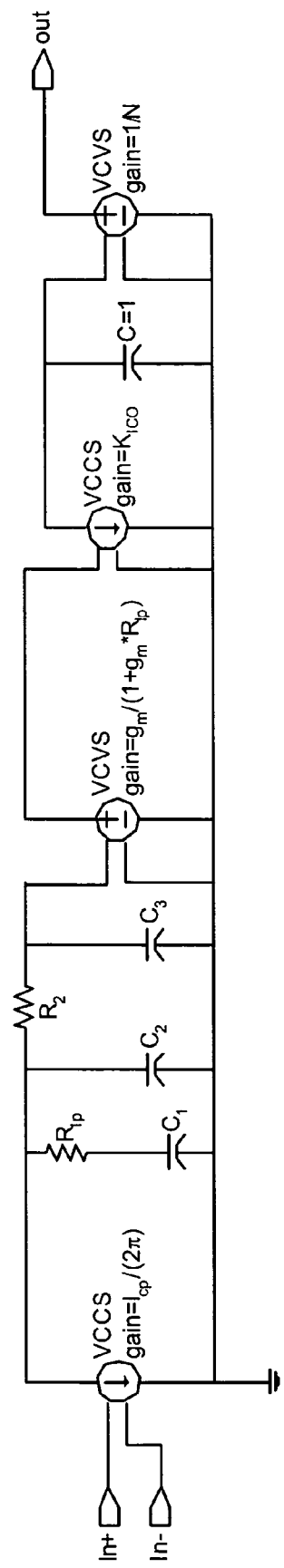
FIG. 44 illustrates a small signal model for a current-mode PLL loop filter according to some embodiments of the present invention.

Assuming that m is 2, $I_{CP}/I_{ICO}$ is ⅛, and $R_{lp}/R_G$ is 1, then the bandwidth is equal to around 230 KHz. Because a high-order RC filter may be used in the current-mode loop filter, there may be more influence from the high-frequency poles, such that the bandwidth may be slightly smaller. A model for simulating the small signal characteristics is shown in FIG. 44. If the frequency multiplication factor is from 30 to 255, then the bandwidth, obtained from simulation, may be between 180 KHz and 250 KHz.

Figure 45:
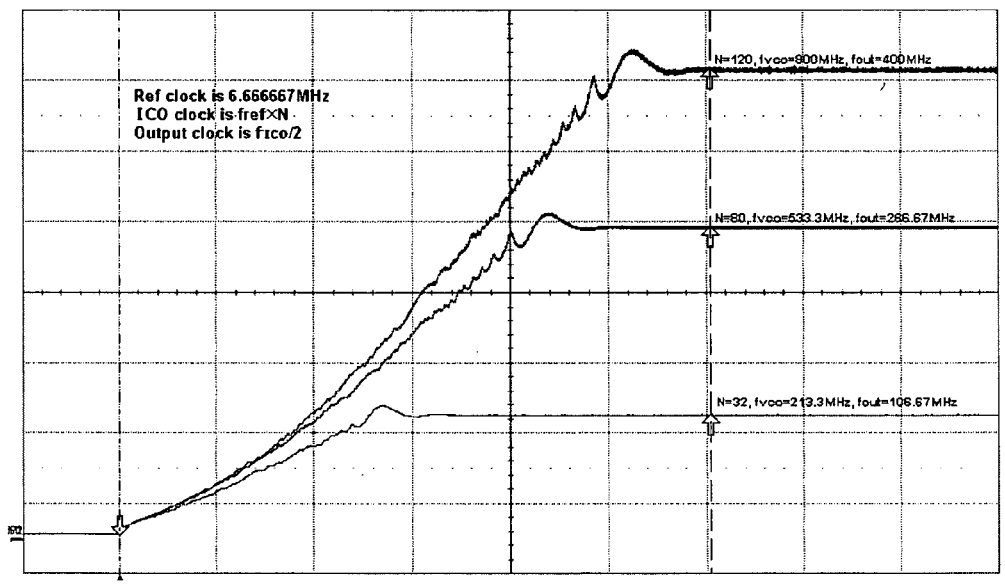
FIG. 45 illustrates transient performance of a PLL according to some embodiments of the present invention.

The aforementioned test chip was fabricated with a 0.35 μm pure digital CMOS process, taking up 0.2 mm² (about 300 μm×650 μm) of chip area. Compared with conventional voltage-mode circuits, the area is reduced by about 15%. FIG. 45 illustrates PLL frequency track for the test device when switching from power down mode to a normal mode. The input clock frequency is 6.66667 MHz. The frequency of the current controlled oscillator (ICO) is the input frequency multiplied by the frequency multiplication factor. The output clock frequency is half of the ICO frequency. The lock time of the PLL changes along with the frequency multiplication factor. For the test chip, the larger the frequency multiplication factor is, the longer the locking time. If the frequency multiplication factor is 120 (output clock 400 MHz), the locking time is about 60 μs; if the frequency multiplication factor is 32 (output clock 106.6 MHz), the locking time is less than 40 μs.

The bandwidth of the circuit does not appear to significantly change with process, temperature, power supply and frequency multiplication factor. The closed-loop bandwidth is different from the open-loop bandwidth. In a second-order PLL, the closed-loop bandwidth and the natural frequency relates each other as follows:

$$\omega_{-3dB} = \omega_n \cdot \sqrt{2\zeta^2 + 1 + \sqrt{(2\zeta^2 + 1)^2 + 1}} \quad (88)$$

The closed-loop bandwidth is generally greater than the open-loop bandwidth. When the damping factor is much larger than 1, they are approximately equal. But the expression for the closed-loop bandwidth of multi-order PLL is more complicated. It is expected that the changing directions of the closed-loop bandwidth and the open-loop bandwidth are the same. The change of the resistance and capacitance may affect the natural frequency and the damping factor, and consequently cause the deviation of the closed-loop bandwidth from the design target. A method for measuring bandwidth involves adding a step to the input clock source and carrying out a discrete Fourier transform on the output phase. From this, a –3 dB bandwidth may be determined. It has been estimated the error is about several kilohertz.

Figure 46:
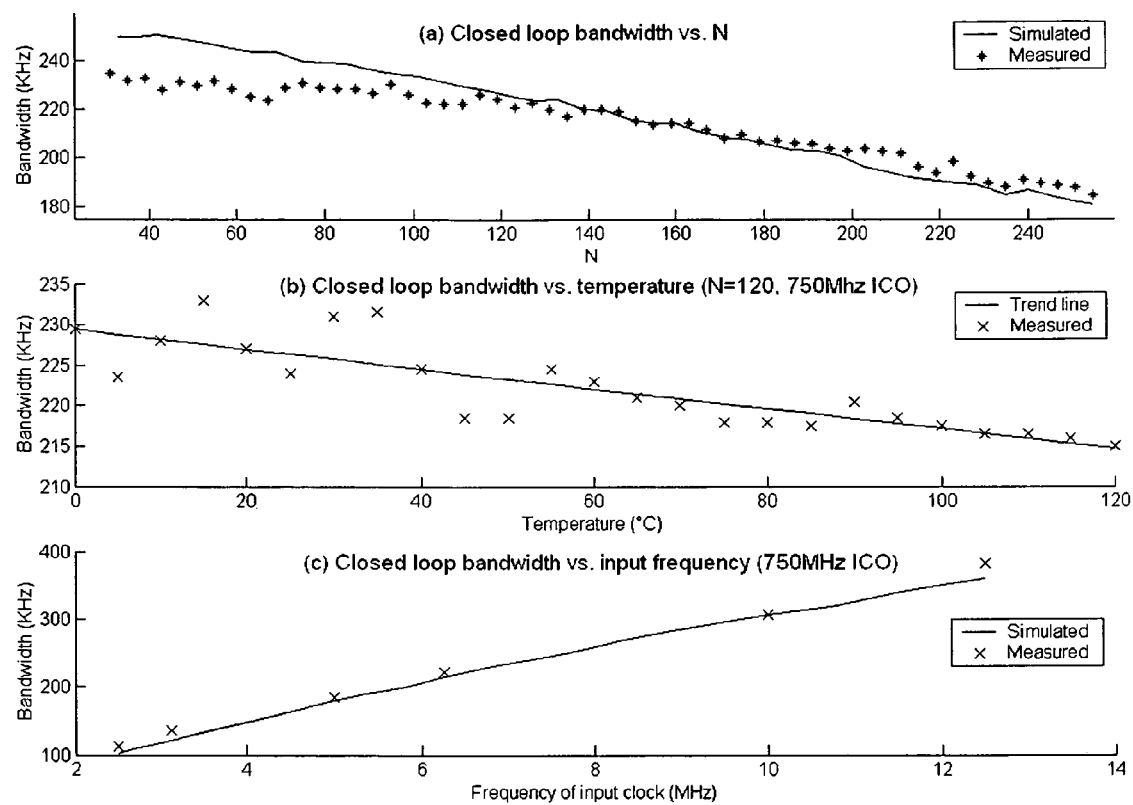
FIG. 46 illustrates bandwidth characteristics of a PLL according to some embodiments of the present invention.

Relationships between closed-loop bandwidth and the frequency multiplication factor in the test chip are shown in FIG. 46(*a*). The simulation results are shown with real lines and the test results are shown with and asterisk (*). For the figure, the input clock is 6.25 MHz. From the chart, there appears to be little relation between the closed-loop bandwidth and the frequency multiplication factor. Along with the increase of the frequency multiplication factor, the bandwidth drops slightly. When the frequency multiplication factor is changed from 30 to 255, the bandwidth changes from 235 KHz to 185 KHz, dropping by 27%. The actual variation of the test chip is smaller than the simulation result.

Relationships between the closed-loop bandwidth and the ambient temperature have also been tested. Referring to FIG. 46(*b*), the input clock frequency is also 6.25 MHz, but the frequency multiplication factor is fixed at 120. Due to the slight change tendency, the test error has already had its influence. A trend line indicates the general change. It can be inferred from the chart that the ambient temperature may have little influence on the bandwidth. FIG. 46(*c*) shows the relationship of the PLL closed-loop bandwidth and the input clock frequency. When carrying out this test, every time the input clock frequency changes, the frequency multiplication factor changes accordingly, which keeps the oscillation frequency at 750 MHz. A multi-order loop filter was used and the position of the high frequency pole fixed. When the bandwidth is changing, the influence of the high frequency pole also changes, so the closed-loop bandwidth and the input clock frequency do not have a linear relationship, which can be confirmed by simulation. In the chart, the lines show the results of the simulation. The test results scatter near the simulation line, with a maximum error of 6%. It appears that the bandwidth changes according to the input clock frequency.

The jitter performance of the test device is also desirable. Jitter characteristics are summarized in Table 1:

TABLE 1

| Jitter Performance | | | |
|---|---|---|---|
| Frequency Multiplication Factor (N) | 30 | 120 | 240 |
| ICO oscillation frequency (MHz) | 200 | 800 | 1600 |
| Output clock (MHz) | 100 | 400 | 800 |
| Period samples (Thousand) | 80 | 320 | 640 |
| Cycle-cycle jitter (rms, ps) | 13.65 | 9.89 | 8.67 |
| Cycle-cycle jitter (peak-peak, ps) | 123 | 99 | 78 |
| Period jitter (rms, ps) | 8.48 | 5.70 | 5.04 |
| Period jitter (peak-peak, ps) | 73 | 55 | 48 |
| Phase jitter (rms, ps) | 99.53 | 30.33 | 16.17 |
| Phase jitter (peak-peak, ps) | 729 | 213 | 121 |

Generally speaking, the test chip confirms that it is feasible to use a current-mode loop filter in a PLL, and that such a PLL can provide desirable performance.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed is:

1. A phase-locked loop (PLL), comprising:
a phase-frequency detector circuit configured to detect an error of an output clock signal in relation to a reference clock signal and to generate a charge pump control signal therefrom;
a charge pump circuit configured to charge and discharge an output node thereof responsive to the charge pump control signal;
a current-mode loop filter circuit coupled to the output node of the charge pump circuit and configured to generate a filtered current from the current at the output node of the charge pump circuit, wherein the current-mode loop filter circuit comprises:
first and second transistors arranged as a current mirror circuit, the first transistor having a current path and a control electrode therefor coupled to the output node of the charge pump circuit; and
a filter network configured to be coupled between the control electrode of the first transistor and a control electrode of the second transistor; and
a current-controlled oscillator configured to generate the output clock signal responsive to the filtered current.

2. The PLL of claim 1, wherein the current-mode loop filter circuit is self-biased.

3. The PLL of claim 1, wherein the current-mode loop filter circuit and the charge pump are biased responsive to a common bias control signal generated by the current-mode loop filter circuit.

4. The PLL of claim 1, wherein the current-mode loop filter circuit is configured to enable and disable current integration responsive to the charge pump control signal.

5. The PLL of claim 4, wherein the current-mode loop filter circuit comprises a switch configured to make and break a coupling of the control electrodes of the first and second transistors through the filter network responsive to the charge pump control signal.

6. The PLL of claim 5:
wherein the charge pump control signal comprises an advance signal and a retard signal;
wherein the charge pump is configured charge and discharge the output node responsive to respective ones of the advance and retard signals; and
wherein the switch is configured to couple the control electrodes of the first and second transistors through the filter network responsive to assertion of either of the advance and retard signals and to decouple the control electrodes of the first and second transistors responsive to deassertion of both the advance signal and the retard signal.

7. The PLL of claim 1, wherein the filter network comprises an RC filter network.

8. The PLL of claim 7, wherein the filter network comprises a second or higher order RC filter network.

9. The PLL of claim 7, wherein the filter network comprises:
a first resistance having a first terminal configured to be coupled to the control electrode of the first transistor;
a second resistance coupled between a second terminal of the first resistance and the control electrode of the second transistor;
a first capacitance coupled between the second terminal of the first resistance and a ground node;
a second capacitance coupled between the control electrode of the second transistor and the ground node; and
a series combination of a third resistance and a third capacitance coupled between the second terminal of the first resistance and the ground node.

10. The PLL of claim 1, wherein the first and second transistors comprise respective NMOS transistors.

11. The PLL of claim 10, wherein the first and second transistors have a channel length substantially greater than a minimum channel length of a fabrication process in which they are implemented.

12. The PLL of claim 11, wherein the first and second transistors are implemented in a 0.35 µm process, and wherein the first and second transistors have a channel length of around 1.5 µm.

13. The PLL of claim 1, wherein the current-mode loop filter circuit further comprises a bias circuit coupled between the current mirror circuit and a power supply voltage source and configured to bias the current mirror circuit responsive to a bias control signal generated at a controlled electrode of the second transistor.

14. The PLL of claim 1, wherein the current-mode loop filter circuit further comprises a noise canceling circuit and a cascade current source coupled between the current mirror circuit and the current-controlled oscillator.

15. The PLL of claim 1, further comprising a feedback divider circuit coupled between the current-controlled oscillator circuit and an input of the phase-frequency detector circuit.

16. The PLL of claim 1, wherein the feedback divider circuit comprises a series combination of a programmable divider and a dual modulus prescaler.

17. The PLL of claim 1, wherein the current-controlled oscillator circuit comprises a current-controlled ring oscillator circuit.

* * * * *